(12) United States Patent
Phung et al.

(10) Patent No.: US 10,916,282 B2
(45) Date of Patent: Feb. 9, 2021

(54) CONTROL OF SWITCHING TRAJECTORY IN SPIN ORBIT TORQUE DEVICES BY MICROMAGNETIC CONFIGURATION

(71) Applicant: INTERNATIONAL BUSINESS MACHINES CORPORATION, Armonk, NY (US)

(72) Inventors: Timothy Phung, Milpitas, CA (US); Chirag Garg, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/447,753

(22) Filed: Jun. 20, 2019

(65) Prior Publication Data
US 2020/0402558 A1    Dec. 24, 2020

(51) Int. Cl.
*G11C 11/00*    (2006.01)
*G11C 11/16*    (2006.01)
(Continued)

(52) U.S. Cl.
CPC ........ *G11C 11/161* (2013.01); *G11C 11/1675* (2013.01); *G11C 11/18* (2013.01); *H01F 10/329* (2013.01); *H01F 10/3254* (2013.01); *H01F 10/3272* (2013.01); *H01L 27/222* (2013.01); *H01L 43/04* (2013.01); *H01L 43/06* (2013.01); *H01L 43/10* (2013.01); *H03K 19/18* (2013.01); *H03K 19/20* (2013.01)

(58) Field of Classification Search
CPC ... G11C 11/161; G11C 11/1675; G11C 11/18; H01L 27/222; H01L 43/06; H01L 43/08; H01F 10/3254; H01F 10/3272; H01F 10/329
See application file for complete search history.

(56) References Cited

U.S. PATENT DOCUMENTS 9,343,658 B2    5/2016    Wang et al.
9,646,670 B2    5/2017    Lee et al.
(Continued)

FOREIGN PATENT DOCUMENTS

CN    109727623 A    5/2019
KR    101729383 B1    4/2017

OTHER PUBLICATIONS

Fukami et al., "A spin-orbit torque switching scheme with collinear magnetic easy axis and current configuration," Nat. Nanotechnol., vol. 11, No. 7, 2016, pp. 621-625.
(Continued)

*Primary Examiner* — Toan K Le
(74) *Attorney, Agent, or Firm* — Schmeiser, Olsen & Watts, LLP; Randall Bluestone

(57) ABSTRACT

A three-terminal device is disclosed having a magnetic tunnel junction (MTJ) and a spin orbit torque (SOT) generating layer. The MTJ has a first magnetic layer, a tunnel barrier layer underlying the first magnetic layer, and a second magnetic layer underlying the tunnel barrier, wherein the SOT generating layer is directly underlying the second magnetic layer. The second magnetic layer has a shape that is non-symmetrical, such that an average magnetization of a remnant state associated with the second magnetic layer has an in-plane component that is orthogonal to a current direction in the SOT generating layer.

27 Claims, 24 Drawing Sheets

(51) Int. Cl.

| | |
|---|---|
| H01F 10/32 | (2006.01) |
| H01L 43/04 | (2006.01) |
| H03K 19/20 | (2006.01) |
| H03K 19/18 | (2006.01) |
| H01L 43/10 | (2006.01) |
| H01L 27/22 | (2006.01) |
| G11C 11/18 | (2006.01) |
| H01L 43/06 | (2006.01) |

(56) References Cited

U.S. PATENT DOCUMENTS

| | | | |
|---|---|---|---|
| 9,830,966 | B2 | 11/2017 | Mihajlovic et al. |
| 2015/0129995 | A1 | 5/2015 | Wang et al. |
| 2016/0267961 | A1 | 9/2016 | Lee et al. |
| 2017/0125078 | A1 | 5/2017 | Mihajlovic et al. |
| 2018/0040807 | A1* | 2/2018 | Saito ............ G11C 11/1659 |
| 2018/0061467 | A1 | 3/2018 | Kan et al. |
| 2018/0190899 | A1 | 7/2018 | Kim et al. |
| 2019/0051339 | A1* | 2/2019 | Zhao ............. G11C 11/1659 |
| 2019/0088860 | A1* | 3/2019 | Saito ............. G11C 11/1659 |
| 2020/0075670 | A1* | 3/2020 | Lin ................. H01L 27/228 |
| 2020/0083429 | A1* | 3/2020 | Lee ................... H01L 43/10 |
| 2020/0135804 | A1* | 4/2020 | Luo ................ G11C 11/161 |
| 2020/0136018 | A1* | 4/2020 | Ying .............. G11C 11/1659 |

OTHER PUBLICATIONS

Matsunaga et al., "Fabrication of a nonvolatile full adder based on logic-in-memory architecture using magnetic tunnel junctions," Appl. Phys. Express, vol. 1, No. 9, 2008, pp. 0913011-0913013.
Berger, "Emission of spin waves by a magnetic multilayer traversed by a current," Phys. Rev. B, vol. 54, 1996, pp. 9353-9358.
Slonczewski "Current driven excitation of magnetic multilayers," J. Magn. Magn. Mater., vol. 159, 1996, pp. L1-L7.
Miron et al., "Perpendicular switching of a single ferromagnetic layer induced by in-plane current injection," Nature, vol. 476, No. 7359, 2011, pp. 189-193.
Liu et al., "Spin-Torque Switching with the Giant Spin Hall Effect of Tantalum," Science (80-. )., vol. 336, No. 6081, 2012, pp. 555-558.
Lee et al., "Emerging Three-Terminal Magnetic Memory Devices," Proceedings of the IEEE, vol. 104, No. 10.,2016, pp. 1831-1843.
Pai et al., "Spin transfer torque devices utilizing the giant spin Hall effect of tungsten," Appl. Phys. Lett., vol. 101, No. 12, 2012, p. 122404.
Emori et al., "Current-driven dynamics of chiral ferromagnetic domain walls," Nat Mater, vol. 12, No. 7, 2013, pp. 611-616.
Ryu et al., "Chiral spin torque at magnetic domain walls," Nat Nano, vol. 8, No. 7, 2013, pp. 527-533.
Fukami et al., "High-speed and reliable domain wall motion device: Material design for embedded memory and logic application," in Digest of Technical Papers—Symposium on VLSI Technology, 2012, pp. 61-62.

Parkin et al., "Magnetic Domain-Wall Racetrack Memory," Science (80-. )., vol. 320, No. 5873, 2008, pp. 190-194.
Liu et al., "Current-induced switching of perpendicularly magnetized magnetic layers using spin torque from the spin hall effect," Phys. Rev. Lett., vol. 109, No. 9, Aug. 2012, p. 96602.
Yamanouchi et al., "Three terminal magnetic tunnel junction utilizing the spin Hall effect of iridium-doped copper," Appl. Phys. Lett., vol. 102, No. 21, 2013, p. 212408.
Lee et al., "Central role of domain wall depinning for perpendicular magnetization switching driven by spin torque from the spin Hall effect," Phys. Rev. B—Condens. Matter Mater. Phys., vol. 89, No. 2, 2014, p. 24418.
Kent et al., "A new spin on magnetic memories," Nat. Nanotechnol., vol. 10, No. 3, 2015, pp. 187-191.
Cubukcu et al., "Spin-orbit torque magnetization switching of a three-terminal perpendicular magnetic tunnel junction," Appl. Phys. Lett., vol. 104, No. 4, 2014, p. 42406.
Garello et al., "Ultrafast magnetization switching by spin-orbit torques," Appl. Phys. Lett., vol. 105, No. 21, 2014, p. 212402.
Aradhya et al., "Nanosecond-Timescale Low Energy Switching of In-Plane Magnetic Tunnel Junctions through Dynamic Oersted-Field-Assisted Spin Hall Effect," Nano Lett., vol. 16, No. 10, 2016, pp. 5987-5992.
Min et al., "A study of write margin of spin torque transfer magnetic random access memory technology," in IEEE Transactions on Magnetics, vol. 46, No. 6, 2010, pp. 2322-2327.
Mellnik et al., "Spin-transfer torque generated by a topological insulator," Nature, vol. 511, No. 7510, 2014, pp. 449-451.
Fan et al., "Magnetization switching through giant spin-orbit torque in a magnetically doped topological insulator heterostructure," Nat. Mater., vol. 13, No. 7, 2014, pp. 699-704.
Demasius et al., "Enhanced spin-orbit torques by oxygen incorporation in tungsten films," Nat. Commun., vol. 7, 2016, p. 10644.
Sinova et al., "Spin Hall effects," Rev. Mod. Phys., vol. 87, No. 4, 2015, pp. 1213-1260.
Koch et al., "Time-Resolved Reversal of Spin-Transfer Switching in a Nanomagnet," Phys. Rev. Lett., vol. 92, No. 8, 2004, p. 88302.
Garello et al., "Symmetry and magnitude of spin-orbit torques in ferromagnetic heterostructures," Nat. Nanotechnol., vol. 8, No. 8, 2013, pp. 587-593.
Miltat et al., "Spin transfer into an inhomogeneous magnetization distribution," J. Appl. Phys., vol. 89, No. 11, 2001, pp. 6982-6984.
Strachan et al., "Direct observation of spin-torque driven magnetization reversal through nonuniform modes," Phys. Rev. Lett., vol. 100, No. 24, 2008, p. 247201.
Zhao et al., "New non-volatile logic based on spin-MTJ," in Physica Status Solidi (A) Applications and Materials Science, vol. 205, No. 6, 2008, pp. 1373-1377.
Bhowmik et al., "Spin Hall effect clocking of nanomagnetic logic without a magnetic field," Nat. Nanotechnol., vol. 9, No. 1, 2013, pp. 59-63.
Leem et al., "Magnetic coupled spin-torque devices for nonvolatile logic applications," J. Appl. Phys., vol. 105, No. 7, 2009, p. 07D102.
International Search Report and Written Opinion, International application No. PCT/IB2020/055307, Applicant's file reference P201803487, filed Jun. 5, 2020, 9 pages.

* cited by examiner

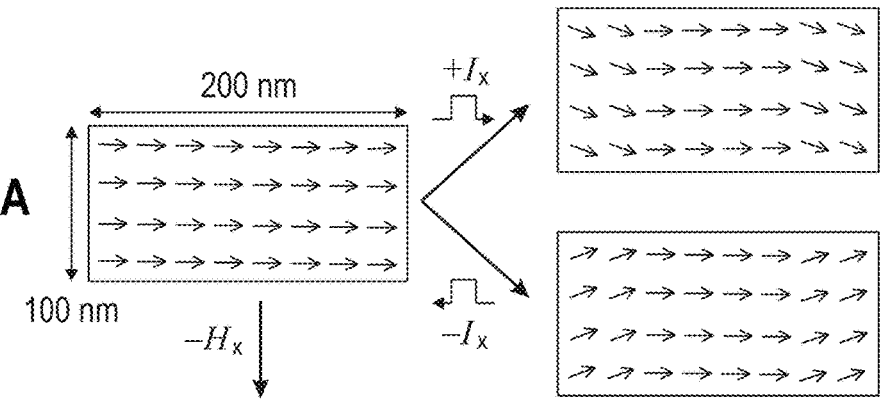
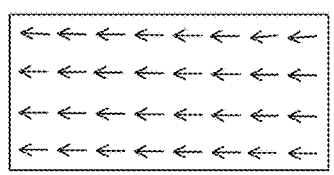
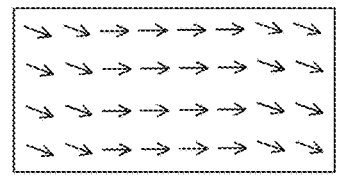
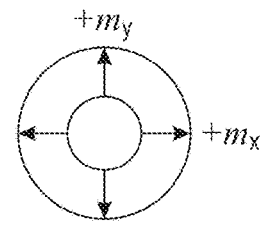
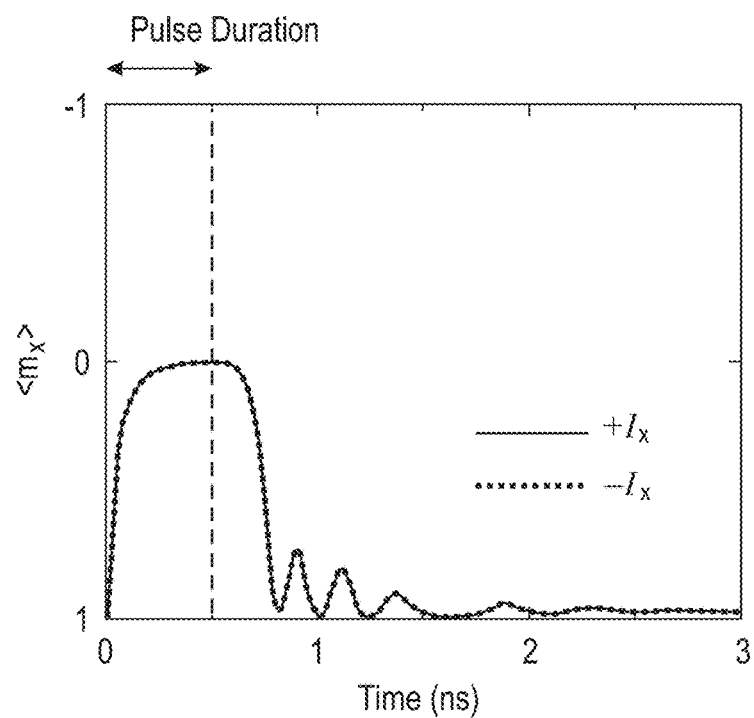
FIG. 4E

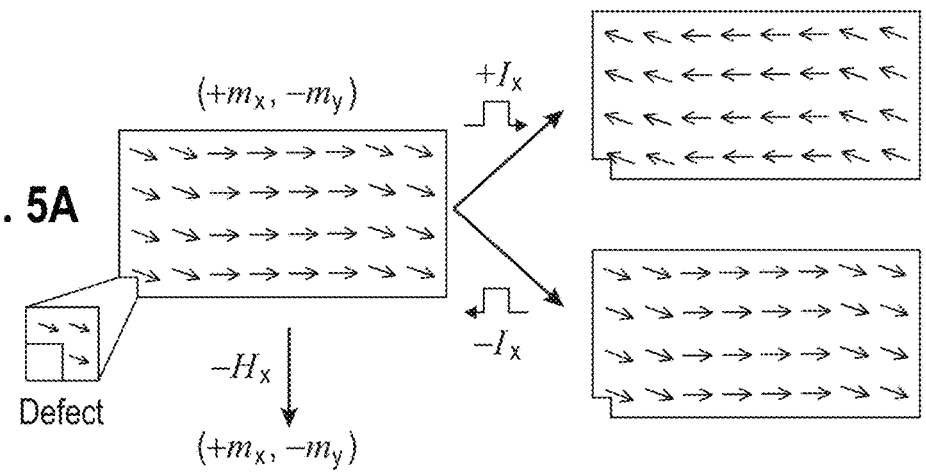
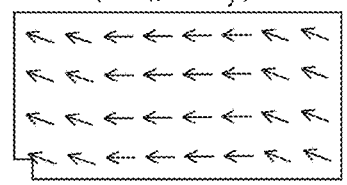
Device #2
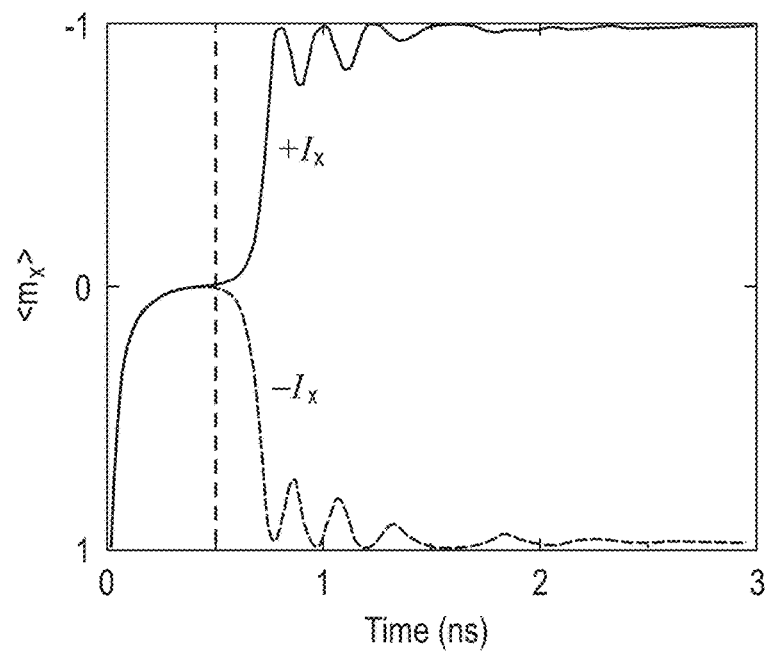
FIG. 5E

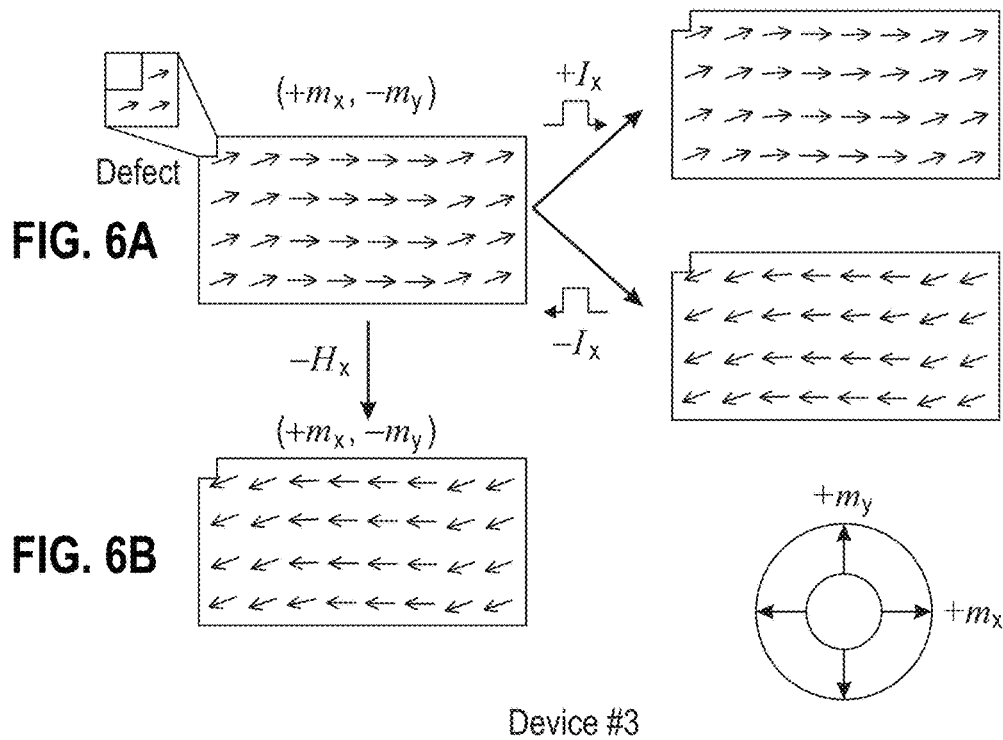
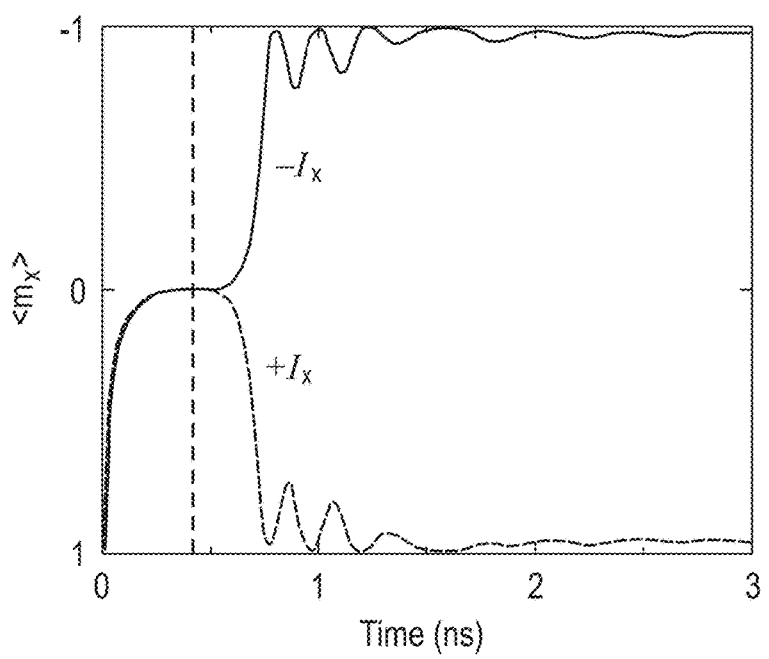
FIG. 6E

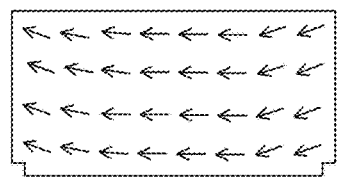
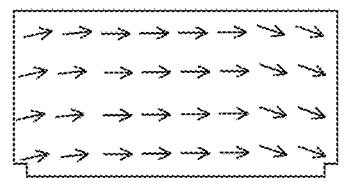
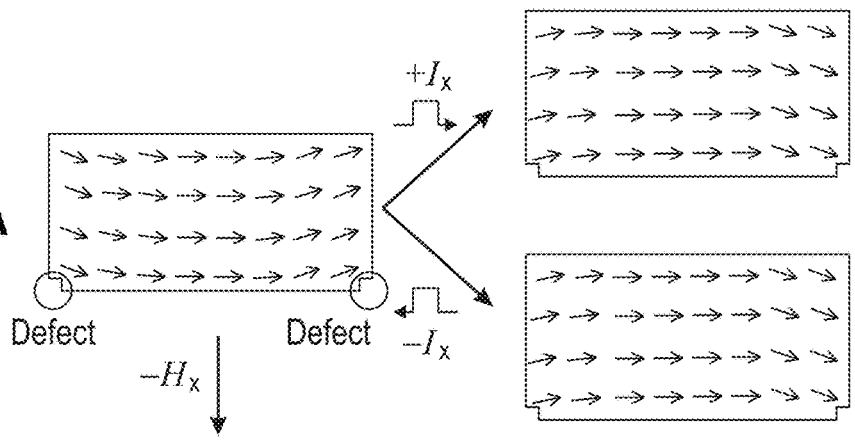
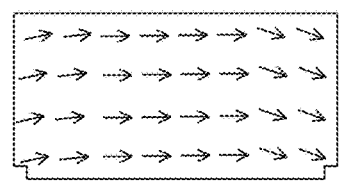
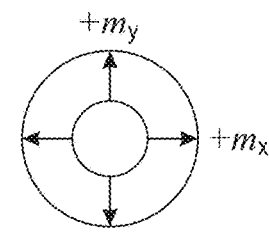
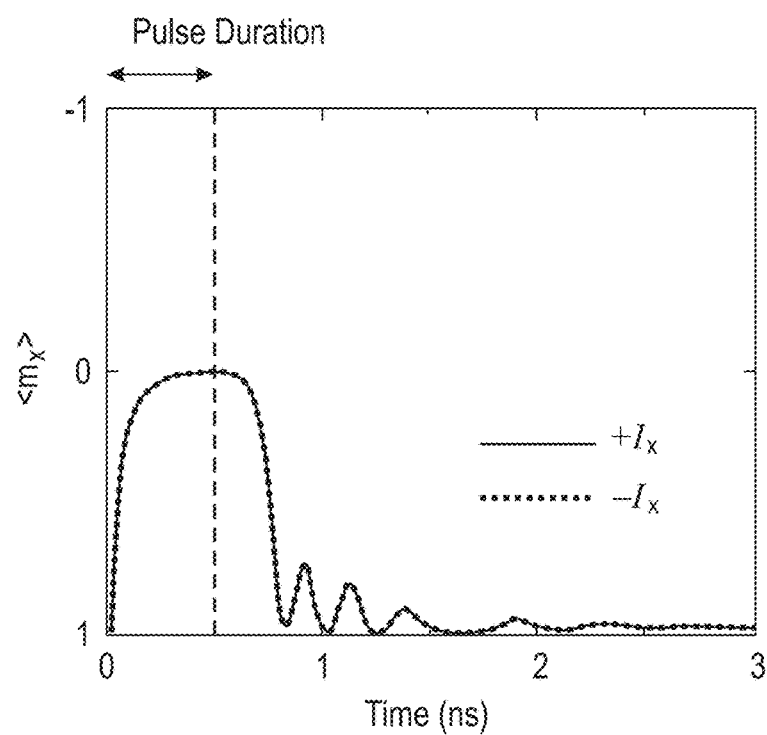
FIG. 7A FIG. 7B FIG. 7C FIG. 7D FIG. 7E

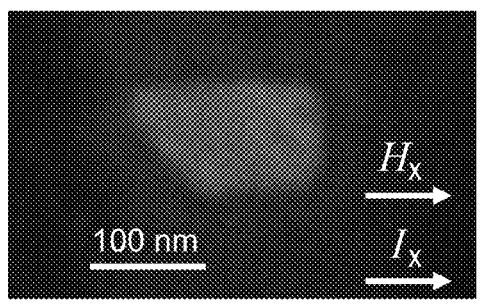 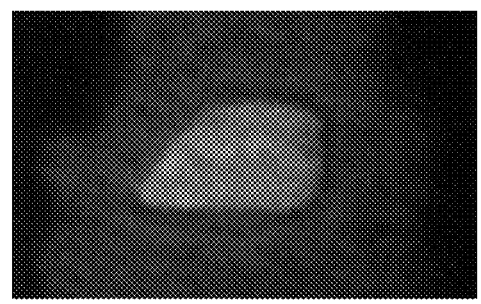
FIG. 11A  FIG. 11B
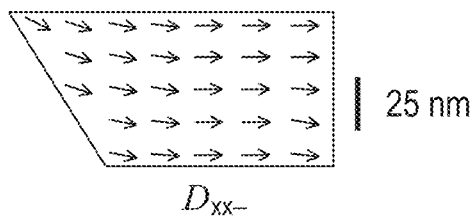 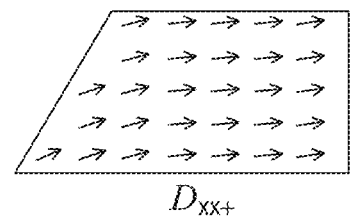
FIG. 11C  FIG. 11D

| Initial $m_x$ | $i_x$ | Final $m_x$ | Switched |
|---|---|---|---|
| ↑ | + | ↓ | yes |
| ↑ | − | ↑ | no |
| ↓ | + | ↓ | no |
| ↓ | − | ↑ | yes |

FIG. 13A

| Initial $m_x$ | $i_x$ | Final $m_x$ | Switched |
|---|---|---|---|
| ↑ | + | ↑ | no |
| ↑ | − | ↓ | yes |
| ↓ | + | ↑ | yes |
| ↓ | − | ↓ | no |

FIG. 13B

| In | $D_{xx+}$ | | $D_{xx-}$ | | Out |
|---|---|---|---|---|---|
| | $m_x$ | R | $m_x$ | R | |
| 1 | ↑ | $R_{ap}$ | ↓ | $R_p$ | 0 |
| 0 | ↓ | $R_p$ | ↑ | $R_{ap}$ | 1 |

FIG. 16

CONTROL OF SWITCHING TRAJECTORY IN SPIN ORBIT TORQUE DEVICES BY MICROMAGNETIC CONFIGURATION

BACKGROUND OF THE INVENTION

Field of Invention

The present invention relates generally to the field of memory and logic devices. More specifically, the present invention is related to non-volatile spintronic memory and logic devices, and circuits that use spin orbit torque phenomenon to switch the magnetization of a proximate magnetic layer.

Discussion of Related Art

There is currently great interest in three-terminal spintronic devices as potential non-volatile replacements for charge-based semiconductor devices in high speed cache memory (such as static random access memory (SRAM)). The writing mechanism is based on the controlled manipulation of magnetic moments using spin transfer torque (STT) generated through spin orbit interactions. One approach towards a three-terminal magnetic memory device is based on the current induced motion of a magnetic domain wall in a nano-scopic wire—a one domain wall Racetrack Memory element. A second approach is by using SOTs to switch the magnetization of an adjacent magnetic nano-element. One mechanism for the readout of the magnetic state in either type of device uses a magnetic tunnel junction (MTJ) based on the tunneling magnetoresistance (TMR) effect. Other readout mechanisms include the anomalous Hall effect.

While being larger in overall footprint than conventional two terminal spin transfer torque-magnetic random access memory (STT-MRAM) MTJ devices, these three-terminal devices may be advantageous for high speed memory applications. The separation of the read and write paths in the three-terminal devices makes optimization of materials and the individual reading and writing schemes considerably more tractable. In addition, one of the wear out mechanisms in conventional STT-MRAM MTJ devices is dielectric breakdown of the tunnel barrier, which occurs when large voltages needed for high speed operation are applied across the tunnel barrier during the write process. In three-terminal devices, this wear-out mechanism is eliminated since the read and write paths are separated.

These three-terminal devices are based predominately on the switching of magnetic nano-elements using spin polarized currents generated in a proximate non-magnetic metallic layer through the spin Hall effect. The spin Hall effect converts longitudinal electrical charge currents into transverse spin currents. For high speed cache memory applications, one requires the replacement device to have both reliable operation and fast switching times. In the conventional three-terminal device configuration, the current-induced spin polarization and magnetization easy axis lie in the same plane and are collinear to each other. While deterministic switching can be achieved in this configuration, the high speed reliable operation at short time scales is difficult to achieve as thermal fluctuations are needed in order to initiate the switching process. This phenomenon is well known in conventional two terminal STT-MRAM devices, and is what leads to so-called "write error rates" for switching below 10 ns.

In modern computing systems utilizing complementary metal oxide semiconductor (CMOS) technology, the devices used for performing computational tasks close to the logical core including the register file, cache memory, and main memory are all volatile. As such, the digital information retained in these devices needs to be transferred to a peripheral non-volatile memory circuit. This data transfer process causes a considerable amount of propagation delay. Further, the access speed of these non-volatile devices is considerably slower than that of the memory located close to the logical core. Thus, there is a need for high speed non-volatile memory and logic circuits that can be placed in close proximity.

Embodiments of the present invention are an improvement over prior art systems and methods.

SUMMARY OF THE INVENTION

In one embodiment, the present invention provides a three-terminal device comprising: (a) a magnetic tunnel junction (MTJ), the MTJ comprising: (i) a first magnetic layer; (ii) a tunnel barrier layer underlying the first magnetic layer; and (iii) a second magnetic layer underlying the tunnel barrier; (b) a spin orbit torque (SOT) generating layer, the SOT generating layer directly underlying the second magnetic layer; and wherein the second magnetic layer has a shape that is non-symmetrical, such that an average magnetization of a remnant state associated with the second magnetic layer has an in-plane component that is orthogonal to a current direction in the SOT generating layer.

In another embodiment, the present invention provides a device comprising: (a) a first magnetic tunnel junction (MTJ), the first MTJ comprising: (i) a first magnetic layer; (ii) a first tunnel barrier layer underlying the first magnetic layer; and (iii) a second magnetic layer underlying the tunnel barrier; (b) a second magnetic tunnel junction (MTJ), the second MTJ comprising: (i) a third magnetic layer; (ii) a second tunnel barrier layer underlying the first magnetic layer; and (iii) a fourth magnetic layer underlying the tunnel barrier; (c) a common spin orbit torque (SOT) generating layer, the common SOT generating layer directly underlying both the second magnetic layer of the first MTJ and fourth magnetic layer of the second MTJ; wherein a SOT generated in the common SOT generating layer sets a first magnetic state in the second magnetic layer and sets a second magnetic state in the fourth magnetic layer, the first magnetic state opposite that of the second magnetic state.

In yet another embodiment, the present invention provides a method, comprising: (a) providing a three-terminal device that includes, in order, a spin-orbit-torque (SOT) generating layer, an in-plane magnetized free layer whose magnetic moment can be switched with spin transfer torque created by the SOT generating layer, a tunnel barrier, and a reference magnetic layer whose orientation remains fixed during device operation, wherein: write-plus and write-minus terminals are in electrical contact with opposite ends of the SOT generating layer; a read terminal is in electrical contact with the reference magnetic layer; and the magnetic free layer has a shape that is non-symmetrical, such that an average magnetization of the free layer's remnant state has an in-plane component that is orthogonal to the current direction; and (b) passing current along the SOT generating layer, between its terminals, thereby switching the magnetic state of the magnetic free layer even in the absence of an applied magnetic field, when the direction of the passed current is oriented along the easy axis of the magnetic free layer.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

FIGS. 4A-4B show the magnetization configuration of the remnant state for a rectangular $D_{xx}$ device with no defects for the +x and −x magnetization directions, respectively.

FIGS. 4C-4D show the final state magnetization map after application of a 500 ps current pulse for positive and negative polarity current pulse, respectively.

FIG. 4E shows the time evolution of average magnetization $<m_x>$ under positive and negative current pulses.

FIGS. 5A-5B show the magnetization configuration of the remnant state for a rectangular $D_{xx}$ device with a defect on the bottom left edge for the +x and −x magnetization directions, respectively.

FIGS. 5C-5D depict the final state magnetization map after application of a 500 ps current pulse for positive and negative polarity current pulse, respectively.

FIG. 5E shows the time evolution of average magnetization $<m_x>$ under positive and negative current pulses.

FIGS. 6A-6B show the magnetization configuration of the remnant state for a rectangular $D_{xx}$ device with a defect on the top left edge for the +x and −x magnetization directions, respectively.

FIGS. 6C-6D depict the final state magnetization map after application of a 500 ps current pulse for positive and negative polarity current pulse, respectively.

FIG. 6E shows the time evolution of average magnetization $<m_x>$ under positive and negative current pulses.

FIGS. 7A-7B show the magnetization configuration of the remnant state for a rectangular $D_{xx}$ device with symmetrical defects for the +x and −x magnetization directions showing stabilization of the C-state, respectively.

FIGS. 7C-7D depict the final state magnetization map after application of a 500 ps current pulse for positive and negative polarity current pulse, respectively.

FIG. 7E shows the time development of average magnetization $<m_x>$ under positive and negative current pulses.

FIGS. 11A-B depict the SEM images of the $D_{xx-}$ and $D_{xx+}$ devices patterned in the form of right-angled trapezoids.

FIGS. 11C-D show the remnant state magnetization is shown as calculated from micromagnetic simulations for $D_{xx-}$ and $D_{xx+}$ devices, respectively.

FIGS. 13A and 13B show the truth table summarizing conditions for switching and not switching for the $D_{xx-}$ and $D_{xx+}$ devices, respectively.

FIG. 16 depicts a truth table describing non-volatile inverter operation.

DESCRIPTION OF THE PREFERRED EMBODIMENTS

Figure 1A:
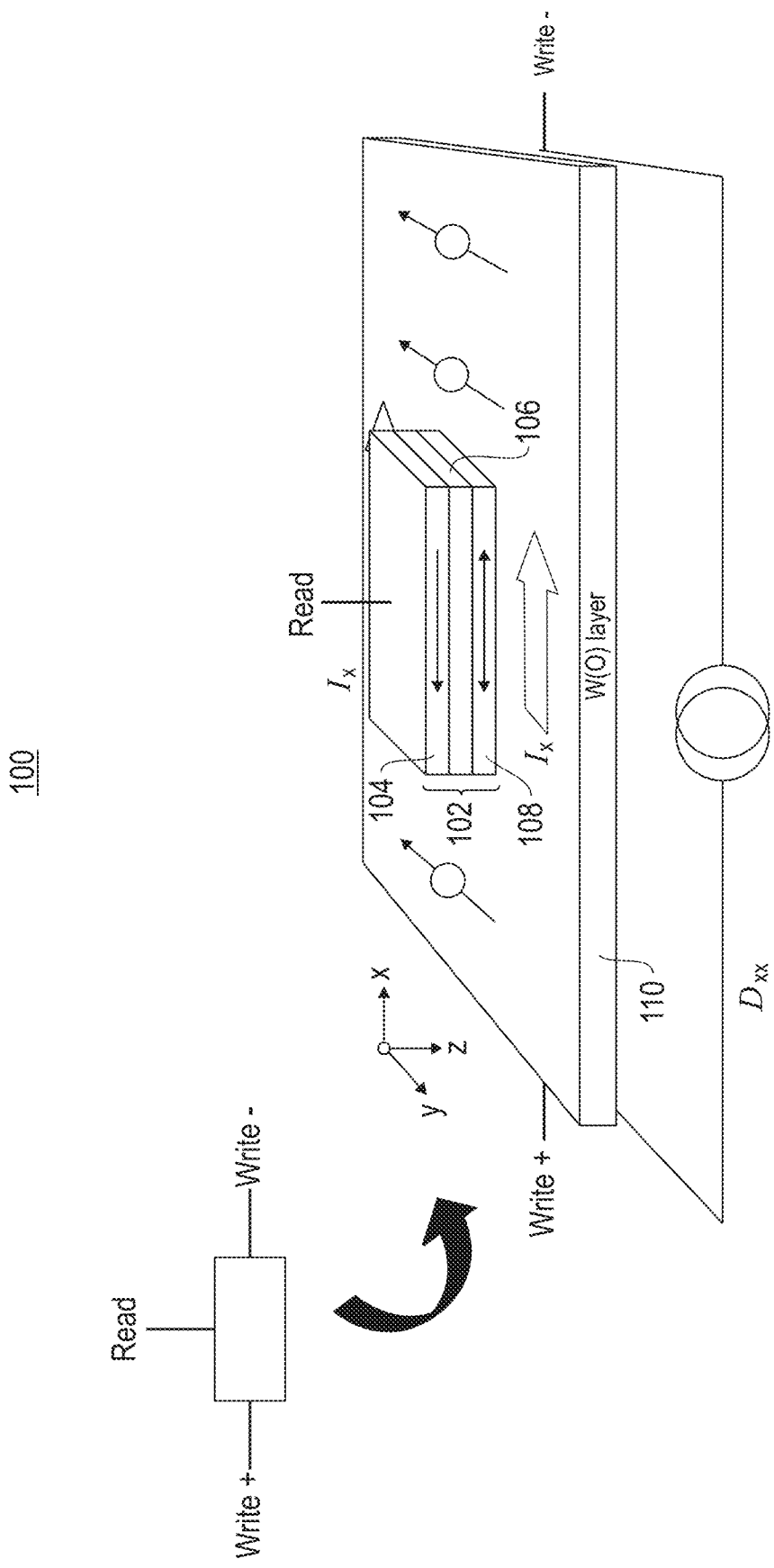
FIG. 1A depicts the schematic diagram of a three-terminal SOT device in the $D_{xx}$ configuration where the easy-axis of the magnetic nano-element is along the x direction, and the current, $I_x$ is collinear to the easy axis direction.

While this invention is illustrated and described in preferred embodiments, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated.

Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of to combinations and/or integrations of the embodiments described herein.

FIG. 1A shows a schematic three-terminal device configuration for switching a magnetic nano-element with spin-orbit torques. This three-terminal configuration is denoted as type $D_{xx}$, where the first subscript denotes the magnetization easy axis of the magnetic nano-element, and the second subscript denotes the current direction. The magnetic nano-element to be switched forms part of a MTJ structure, and the magnetic nano-element is in direct contact with a layer that generates SOTs upon the application of current through it. This layer is denoted throughout as the spin orbit layer.

The three-terminal device 100 comprises (a) a magnetic tunnel junction (MTJ) 102, the MTJ 102 comprising: (i) a first magnetic layer 104; (ii) a tunnel barrier layer 106 underlying the first magnetic layer 104; and (iii) a second magnetic layer 108 underlying the tunnel barrier 106; and (b) a spin orbit torque (SOT) generating layer 110, the SOT generating layer 110 directly underlying the second magnetic layer 108. In FIG. 1A, the magnetization direction in the MTJ and the current-induced spin polarization direction in the SOT generating layer are orthogonal to each other. Also, in FIG. 1A, a first contact and a second contact are disposed at opposite ends in the SOT generating layer 110 and a third contact is disposed on the first magnetic layer 104.

Examples of materials to be used for the first magnetic layer include synthetic antiferromagnetic layers composed, for instance, of CoFe based alloys that are separated by Ru layers, and exchange biased layers where a thin ferromagnetic layer comprised of CoFe based alloys is placed adjacent to an antiferromagnet such as IrMn or PtMn. The tunnel barrier is typically composed of MgO, and the second magnetic layer is also composed of CoFe based alloys. Non-limiting examples of materials used for magnetic layers include CoFe alloys (e.g., CoFeB) and NiFe alloys (e.g., $Ni_{80}Fe_{20}$).

The spin orbit layer is connected electrically at its two ends such that when a voltage source is applied, the current $(I_x)$ flowing in the spin orbit layer travels in a direction parallel to the easy axis of the magnetic free layer adjacent to it and generates spin-orbit torques (SOT) in the magnetic layer. This conduction channel is the writing path. The mechanism behind the SOT generation in this device is through the spin Hall effect which occurs in heavy metals such as Pt, W, and Ta, and their alloys. In a non-limiting example, the SOT-generating layer is an oxygen doped tungsten layer W(O) that is formed by reactively sputtering a thin tungsten thin film in the presence of oxygen. This material has been experimentally demonstrated to yield a spin Hall angle of −50%. The third terminal of the device is connected to the top of the MTJ so that the resistance state of the MTJ can be discerned through magneto-resistive readout from the tunneling magneto-resistance effect. The read out can be done by flowing current through any of the writing terminals and the terminal connected to the top of the MTJ. In the preferred embodiment, current pulses of a sufficient current density and of nanosecond timescale are applied to the writing channel and depending on the direction of the current, the magnetic state of MTJ can be set along with its ensuing resistance state.

Figure 1B:
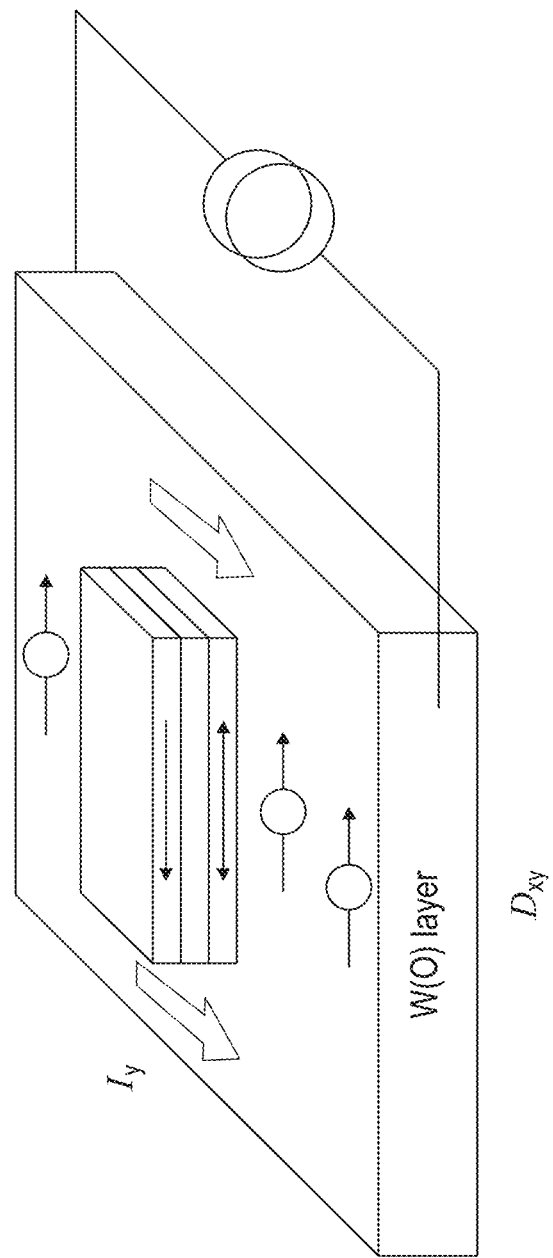
FIG. 1B depicts the schematic diagram of the three-terminal SOT device in the $D_{xy}$ configuration where the easy-axis of the magnetic nano-element is along the x direction, and the current, $I_y$ is orthogonal to the easy axis direction.

FIG. 1B shows, for comparison, the prior art method of switching a magnetic nano-element in the three-terminal configuration. We shall denote this three-terminal configuration as type $D_{xy}$.

In the $D_{xx}$ type of the device, the magnetization and current-induced spin polarization are orthogonal to each other when the SOT is initially applied. In contrast, for the $D_{xy}$ device (FIG. 1B), the magnetization and spin polarization in the incipient state are collinear to one another. Switching is not expected to occur in the $D_{xx}$ device because the SOT only rotates the magnetization towards the in-plane hard axis direction (±y direction). Upon removing current through the W(O) layer in the $D_{xx}$ device, the magnetization rotates back towards its initial direction.

Figure 1C:
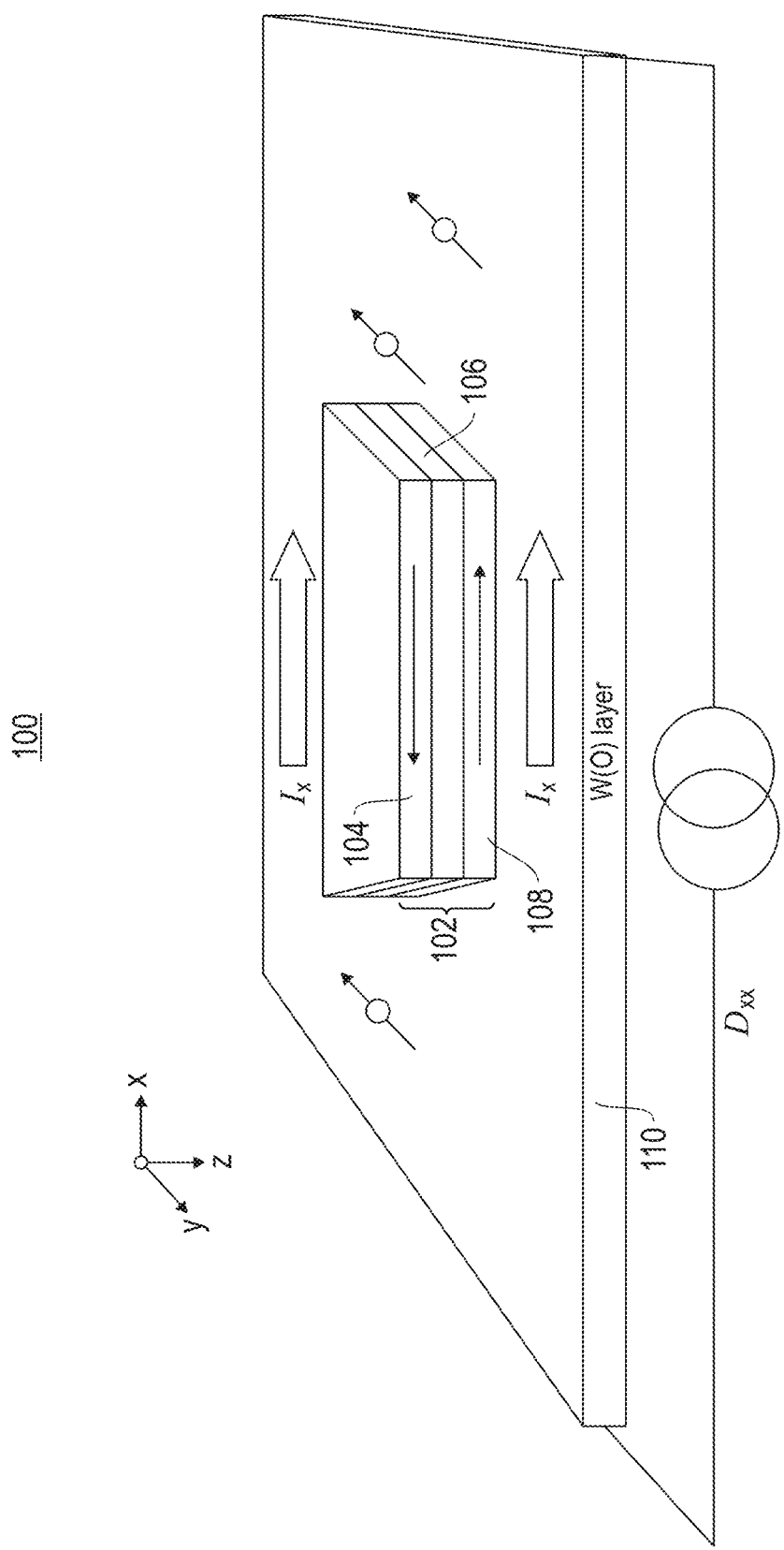
FIG. 1C depicts a schematic diagram of the preferred embodiment of this invention where the magnetic nano-element has a non-symmetrical shape.

FIG. 1C depicts a schematic diagram of the preferred embodiment of this invention where the magnetic nano-element has a non-symmetrical shape. The magnetic nano-element has a shape that is non-symmetrical, such that the average magnetization of the remnant state has an in-plane component that is orthogonal to the current direction. The current direction and easy axis of the magnetic nano-element are collinear in the preferred embodiment.

Figure 2A:
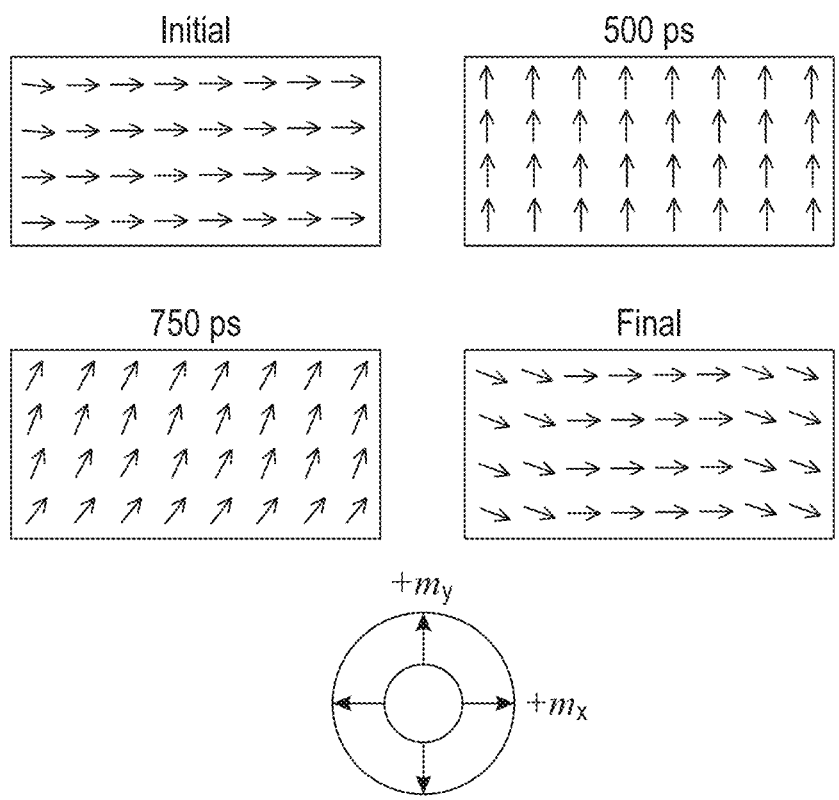
FIG. 2A shows time resolved magnetization maps from micromagnetic simulations showing the absence of switching in the $D_{xx}$ configuration when a 500 ps long positive current pulse is applied to the W(O) layer.
Figure 2B:
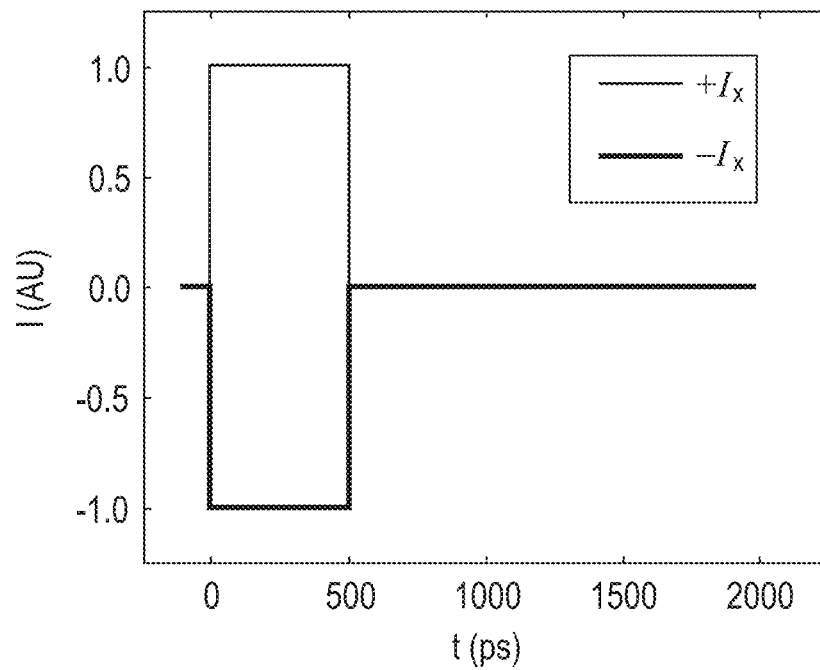
FIG. 2B shows the current pulses used in micromagnetic simulations.

FIG. 2A illustrates this by time-resolved micromagnetic simulations of SOT switching of a 200 nm×100 nm element in the $D_{xx}$ configuration under a 500 ps long positive current pulse that is shown in FIG. 2B. In this simulation, the SOT is modeled as a damping like torque originating from the spin Hall effect. As expected, the micromagnetic simulation shows that the magnetization rotates towards the in-plane hard axis direction of the device (±y direction for $±I_x$ current, respectively) (FIG. 2A top right panel). The damping like contribution of the SOT (given by $\vec{\tau}=a_j\vec{m}\times(\vec{p}\times\vec{m})$, where $\vec{\tau}$ is the STT, $a_j$ is the damping like spin torque parameter, in is the normalized magnetization, and $\vec{p}$ is the spin polarization) vanishes when the magnetization rotates towards the spin polarization direction. Thus, the magnetization cannot be driven past the hard axis orientation, and consequently there is no magnetization reversal regardless of current polarity applied to the W(O) layer (FIG. 2B).

While these simulations are performed in the zero temperature limit, thermal fluctuations at finite temperature may drive reversal of the magnetization, as the energy barrier for the magnetization to rotate towards the ±x direction is suppressed when the magnetization is at the hard axis direction. However, such a reversal mechanism is stochastic and not useful for technological applications. The role of thermal fluctuations in the switching process for $D_{xy}$ and $D_{xx}$ devices is thus complementary. For the $D_{xy}$ device, thermal fluctuations are responsible for initiating switching dynamics, but as the cone angle for the magnetization precession builds up for reversal, SOT increases in magnitude driving the reversal process. In the $D_{xx}$ device, SOT initiates the switching process, but thermal fluctuations set up an initial bias point for the ensuing magnetization reversal to occur after the application of current to the W(O) layer.

Based on this understanding, deterministic switching in the $D_{xx}$ configuration can occur if there is an internal magnetic field to seed a reversal process when the magnetization is brought towards an intermediate hard axis state by SOT. Thus, fast switching may take place without the need for thermal fluctuations at either the beginning or intermediate points of the switching trajectories.

Figure 3A:
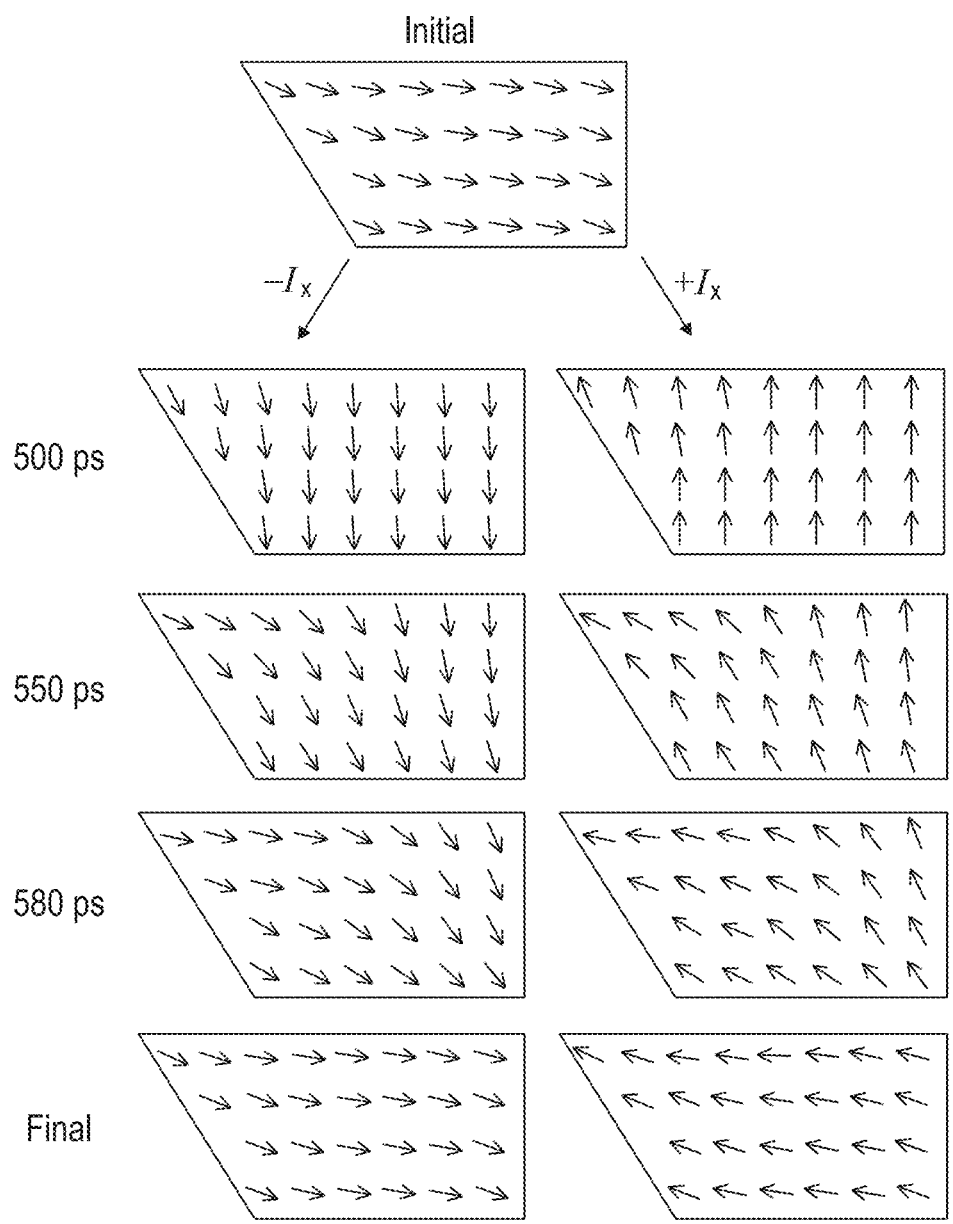
FIGS. 3A and 3B illustrate time resolved magnetization maps from micromagnetic simulations showing current induced switching in right angled trapezoid patterned elements with a negative sloped left leg ($D_{xx-}$). Current induced switching from the +x and −x state occurs with a positive and negative current, respectively, following the application of a 500 ps current pulse.
Figure 3B:
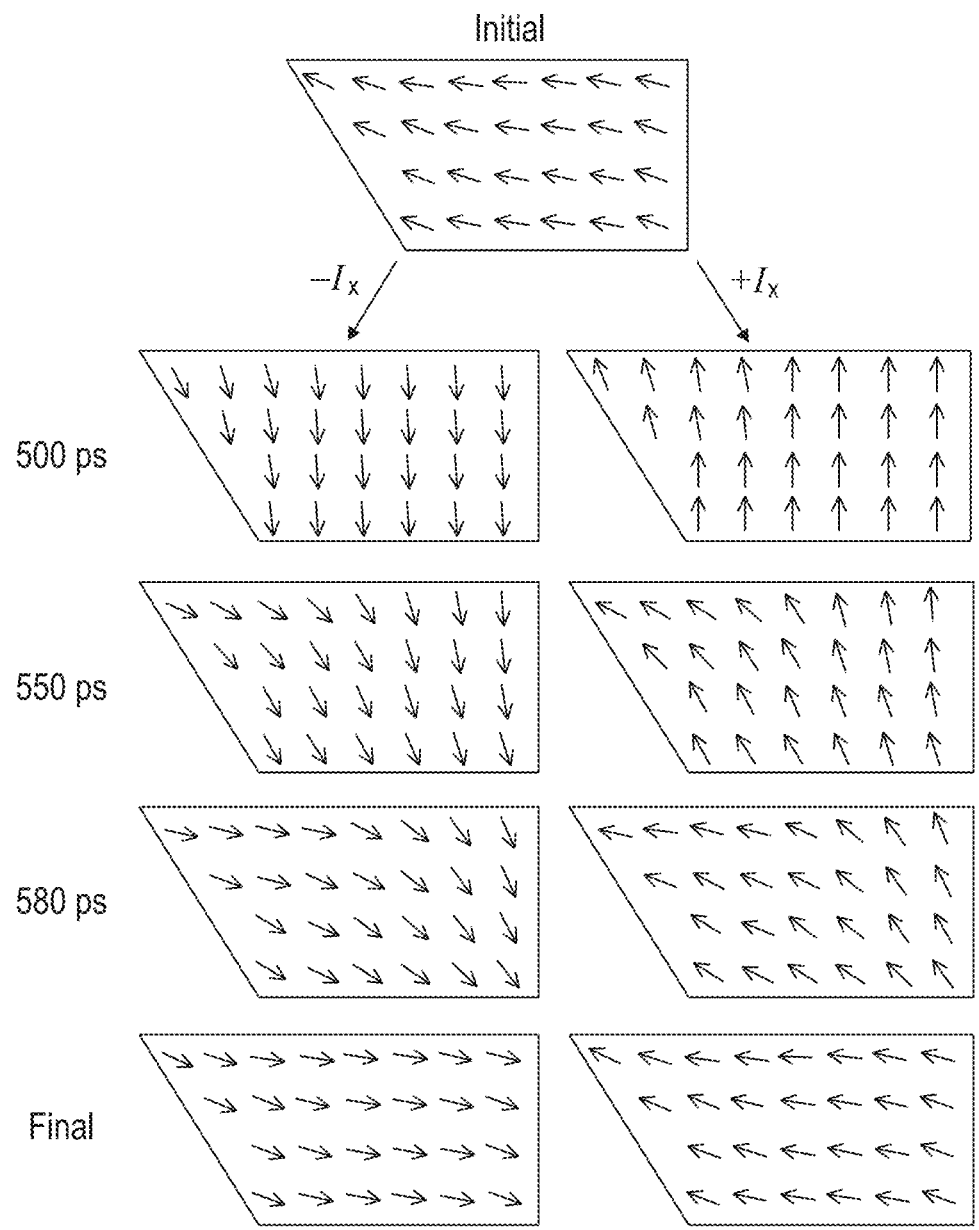

Micromagnetic simulations of a magnetic nano-element that has the shape of a right trapezoid are shown in FIGS. 3A-3B and are subjected to the same current pulses as in FIG. 2B. Micromagnetic simulations show that the magnetization rotation towards the in-plane hard axis direction under SOT is greater in the wider section of the trapezoid, while the magnetization in the narrow section of the trapezoid favors pointing tangentially to the nano-element boundary (FIGS. 3A-3B 500 ps time frame). This arises since the shape anisotropy energy density is greater in the narrower section of the trapezoid. Depending upon the polarity of the current pulse, the magnetization at the trapezoid tip either has a component along the initial magnetization direction or opposite to it (FIGS. 3A-3B compares the magnetization at 500 ps for $\pm I_x$). The preferred moment orientation is determined by the internal effective magnetic fields of the nano-element, and originates predominately from the magnetostatic and exchange interactions.

This can also be observed in the nano-element remnant state, where the magnetization of the sloped edge of the trapezoid is correlated with the magnetization state of the rectangular region. Magnetization reversal can occur through growth of the domain starting from the top left corner, upon removal of the current pulse. If the magnetization has a component along the same direction as the initial state in the trapezoid tip, then switching does not occur. Similar arguments apply to the case where the magnetization starts from the −x orientation, wherein reversal only occurs with a negative current (FIG. 3B). Furthermore, in the case of a right trapezoid, where the left leg has a positive slope, the currents required for switching to the +x configurations become $\pm I_x$. The switching current magnitude is equivalent for switching to the ±x states under this mechanism. Thus, deterministic switching with controlled switching current polarity can be achieved in the $D_{xx}$ device without an external magnetic field, through engineering the sample geometry so that the internal magnetic field can initiate the reversal process.

Indeed, even the presence of small lithographic defects that routinely occur due to line edge roughness affect the micromagnetic state significantly enough in the $D_{xx}$ configuration to affect its switching dynamics. To illustrate this, three different magnetic nano-elements of dimensions 200 nm×100 nm in the $D_{xx}$ configuration are considered where identical current pulses as to what is used in the simulations shown in FIG. 2B are applied. In the first case (FIGS. 4A-4E), the nano-element is a perfect rectangle but in the other two cases a defect is introduced in the form of a missing voxel that is 6 nm×6 nm in size at either the top-left (FIGS. 5A-5E) or the bottom-left (FIGS. 6A-6E) corner of the nano-element. Each figure (FIGS. 4A-4B, FIGS. 5A-5B, FIGS. 6A-6B) shows the relaxed state of the magnetization for each structure. These devices are referred to as device #1, #2 and #3 in the following discussion.

In the relaxed state of device #1, although the moments curl towards the edges under the influence of the demagnetizing field, the net magnetization along the y-axis, $<m_y>$ is zero. When a current pulse is applied across the W(O) layer, the damping-like torque from the SOT will cause the magnetization to rotate temporarily towards the direction orthogonal to the easy axis. When the current pulse is removed, the magnetization relaxes towards the easy axis in the same orientation as the initial state of the nano-element, as shown in the end state of the magnetization upon the application of a positive (+$I_x$) and negative (−$I_x$) current pulses (FIGS. 4C and 4D, respectively). This dynamical process is shown in the time evolution of the spatial average of the magnetization in the nano-element $<m_x>$ upon the application of the current pulses (FIG. 4E). There is no switching here because when the SOT brings the magnetization orthogonal to the easy axis, there are no additional torques present to cause magnetization rotation.

In the case of device #2 (FIGS. 5A-5B), a defect is introduced at the lower left corner and the relaxed magnetization state acquires a finite $m_y$ component in the form of edge domains in the nano-element. The relaxed state shown here is referred to as the S-state. It is noted that the $m_y$ component is correlated to the state of the $m_x$ component (that is, the S-state has two different orientations). This S-state is stabilized due to the placement of the defect which induces internal magnetostatic fields and breaks the symmetry along the y-axis. Upon application of a current pulse, the magnetization rotates towards the spin accumulation direction. However, the demagnetizing field induced from the edge geometric defect provides an additional torque to drive reversal. Hence, switching is observed upon removal of the current pulse (FIG. 5C). For the opposite current pulse polarity (FIG. 5D), the internal fields act in +x direction, and no switching is observed. The time evolution of the magnetization during this switching process is summarized in FIG. 5E. Here the "quasi-ballistic" nature of the switching process is evident as well.

The defect is placed on the opposite edge for device #3, and thus, the sense of internal magnetostatic fields is opposite. It is noted that the orientation of the S-state in the remnant state of the magnetization is opposite to the second case (FIGS. 6A and 6B). As a consequence of the position of defect, not only are the remnant states different, but the switching behavior with respect to the current polarity is reversed (FIGS. 6C-6E). Thus, the position of these small lithographic defects is critical in influencing both the remnant state as well as the switching current polarity, and its overall switching trajectory.

A remarkable feature of the $D_{xx}$ switching process is that the switching process is characterized by a monotonic evolution of $<m_x>$ as well as a coherent rotation of moments across the entire free layer (as evidenced by the plots of the time evolution of the magnetization (FIG. 5E and FIG. 6E). In contrast, the $D_{xy}$ devices show a non-monotonic evolution in time of $<m_x>$ as well as non-coherent reversal, involving many metastable states. As a result, the switching times can be much longer for $D_{xy}$ in comparison to $D_{xx}$.

It is also noted in the case that the defects are placed symmetrically about the device geometry and share a common edge, switching does not occur. Further noted is that if the trapezoid is entirely symmetric about the x-axis, switching does not occur, as the magnetization on the two edges of the nano-element rotate in opposite directions. In this case, the remnant state magnetization corresponds to a C-state (FIGS. 7A-7B). Accordingly, the edge domains point in opposite direction both in the remnant state and upon the application of current pulse. Under the application of current pulse to the spin orbit layer, the demagnetizing fields induced by the defects provide torques on the edges of the nano-element in opposite directions. Thus, there is no net $m_x$ component generated at the end of the current pulse and switching does not occur (FIGS. 7C-7E)

Figure 8A:
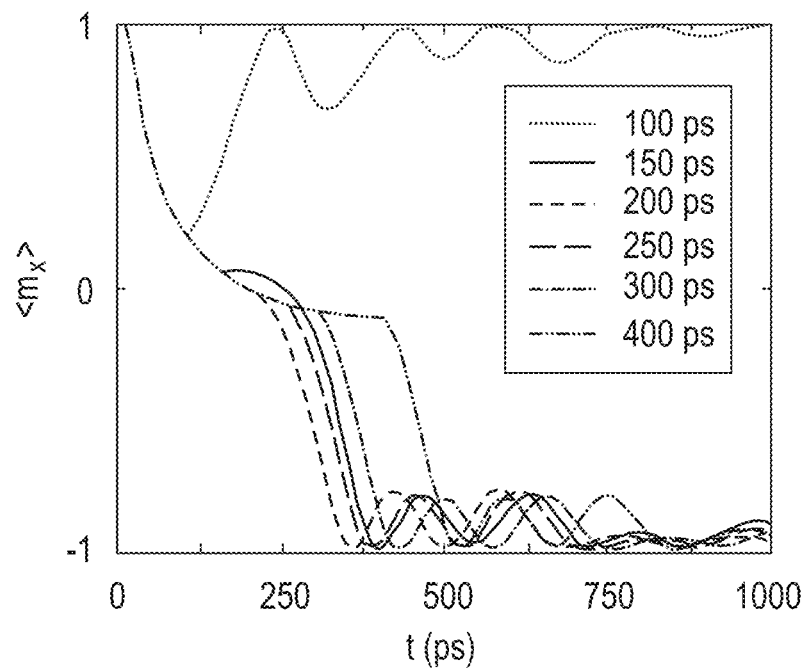
FIG. 8A illustrates the time evolution of $<m_x>$ for various current pulses for a $D_{xx-}$ device.

Micromagnetic simulations also show that the $D_{xx}$ switching process based on this mechanism can be faster than the $D_{xy}$ switching process, as characterized by a monotonic evolution of the spatial average of the magnetization of the nano-element $<m_x>$ with respect to time. Micromagnetic simulations were performed to understand the fast time scale switching dynamics of a right trapezoid device (in particular, a $D_{xx-}$ device type). The spatial average of the normalized magnetization component in the x direction $<m_x>$ is plotted as a function of time in FIG. 8A for various current pulses with current pulse widths ranging from 100 ps to 400 ps for current running in the +x direction. The initial state of the magnetization in each simulation is oriented predominately in the x direction, as illustrated in the snapshot from the micromagnetic simulation in FIG. 9A.

Figure 8B:
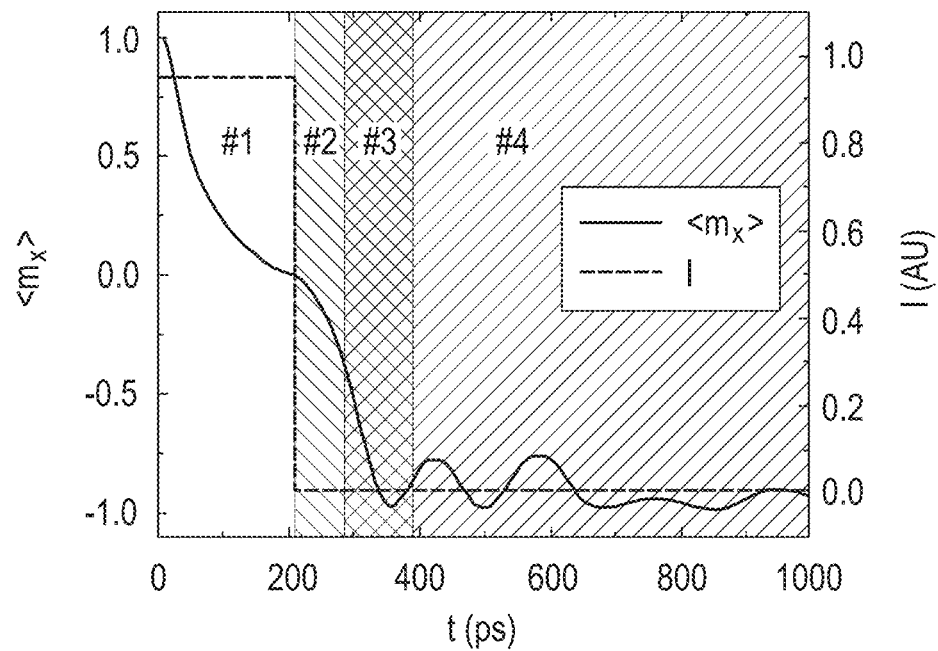
FIG. 8B depicts the current pulse and magnetization vs. time for the 200 ps case, with a four-step magnetization reversal process outlined.

The switching process occurs through four steps that can be identified from the time traces and is demarcated for the case of a 200 ps current pulse (FIG. 8B). 1) The magnetization is first rotated from the +x direction towards the +y direction through the SOT. 2) After 200 ps, in which case the current is removed, due to the shape anisotropy induced by the right trapezoid shape, the magnetization acquires a small component in the reversed direction as described in the main text. 3) The magnetization reversal occurs through growth of a domain wall. 4) The magnetization relaxes to its final equilibrium state through precession abut its equilibrium state. Fast switching with pulse widths as short as 150 ps (see FIG. 8A solid black line) can be achieved using this mechanism. Further noted is that the switching is "quasi-ballistic", and switching is achieved within almost one precession cycle. The relaxation of the magnetization in step 4), however, involves several precessions, but is deterministic. Unlike other fast time scale switching schemes using non-collinear moments, this scheme is insensitive to the width of the current pulse used when the current pulse exceeds a critical pulse width.

Figures 9A, 9B, 9C:
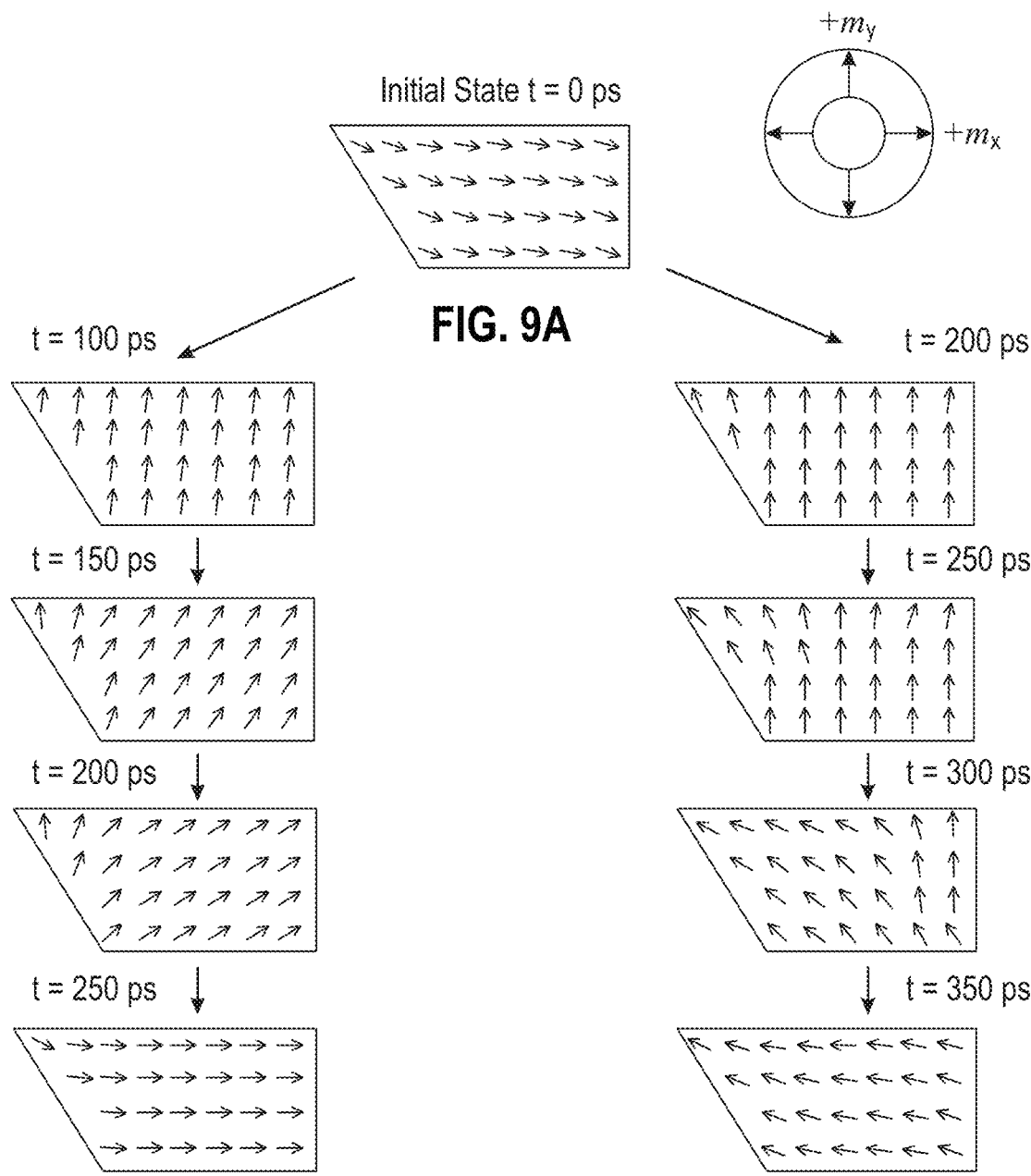
FIG. 9A depicts the magnetization configuration of initial state for a right trapezoid device $D_{xx-}$ type as calculated by micromagnetic simulations.
FIG. 9B shows magnetization maps showing time evolution of magnetization for a non-switching event with a current pulse width of 100 ps.
FIG. 9C shows the magnetization maps showing time evolution of magnetization for a switching event with a current pulse width of 200 ps.

FIGS. 9B and 9C compare the switching dynamics for a non-switching and switching event. In the 100 ps current pulse width case, where switching does not occur, the magnetization rotates towards the +y direction due to the SOT, but does not have sufficient time to reorient to be fully orthogonal to the current direction. Consequently, the magnetization does not develop any component along the reversal direction at the end of the current pulse. The return of the magnetization towards its initial direction initiates from a domain formed on the top right corner of the nano-element. This edge is preferred given the lower shape anisotropy density. By contrast, for the 200 ps case, at the end of the current pulse the magnetization has rotated orthogonal to the current direction, and develops a component along the reversal direction, which is what later forms the nucleation point for the reversal domain that moves in from the top left corner of the nano-element. The magnetization switches within one precession cycle and does not involve any vortex states.

Figure 10A:
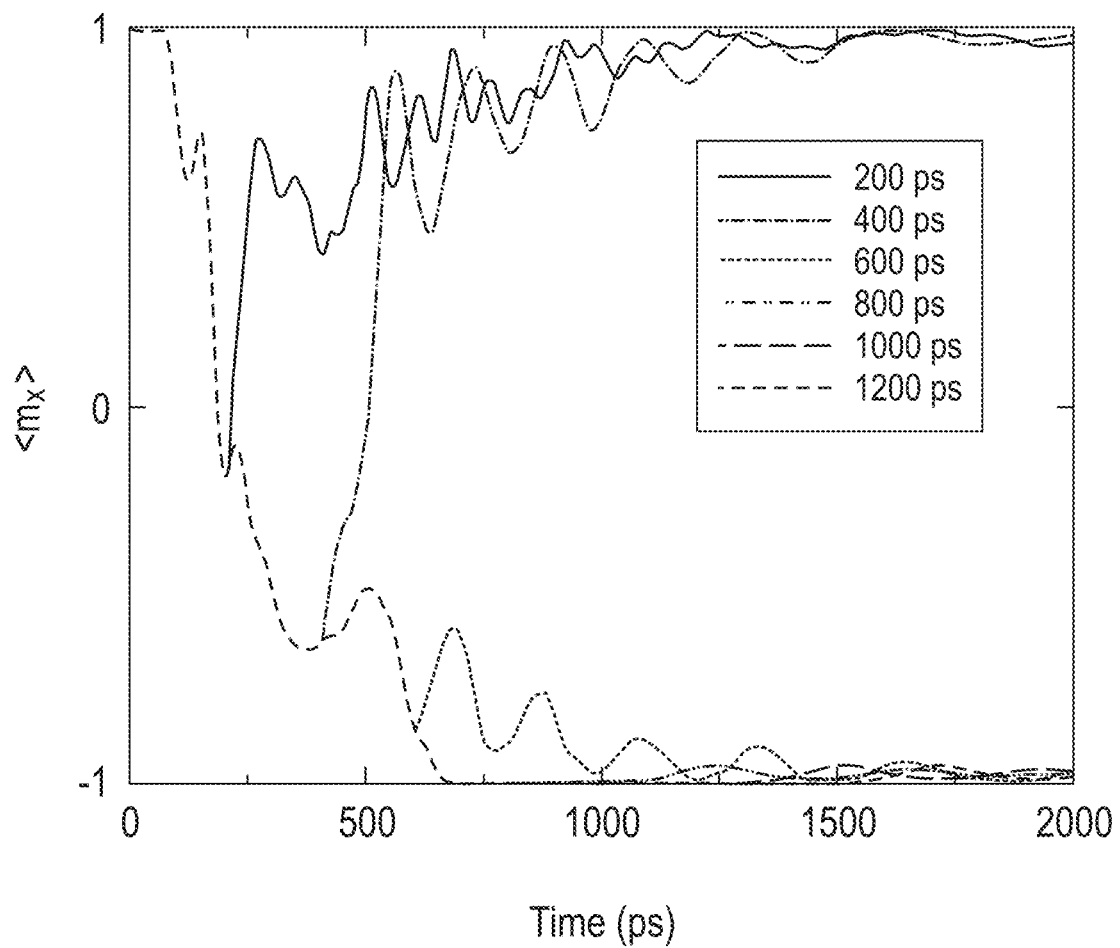
FIG. 10A shows the time progression of $<m_x>$ for various current pulses for a $D_{xy}$ device.

In contrast, the switching of $D_{xy}$ devices at the same current density requires several precession cycles during the reversal process, and involves many metastable vortex states. Micromagnetic simulations were performed on the $D_{xy}$ device to compare its switching dynamics with the $D_{xx}$ device. The simulations were performed on a rectangular device with dimensions of 200 nm×100 nm, identical to the $D_{xx}$ device considered in FIGS. 4A-4E, and for current pulse lengths ranging from 200-1200 ps. The evolution of $<m_x>$ with respect to time (FIG. 10A) during the current pulse is non-monotonic. Moreover, the $D_{xy}$ device involves many precession cycles for switching to occur, while the $D_{xx}$ device switches within one precession cycle.

Figure 10B:
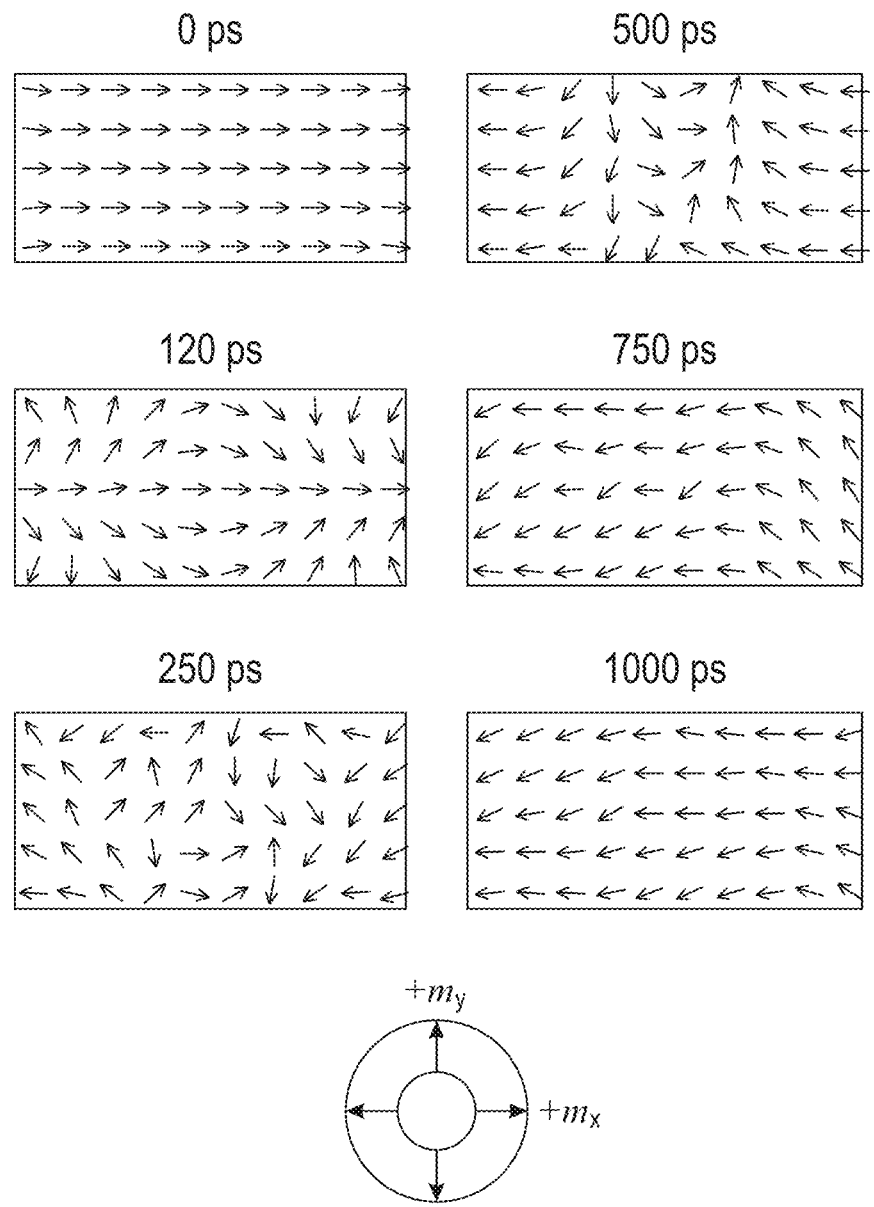
FIG. 10B shows the magnetization maps showing time evolution of magnetization for a switching event with a current pulse of 600 ps.

Time resolved magnetization maps from the simulations show that the magnetization reversal process under a 600 ps current pulse for the $D_{xy}$ is complex and incoherent, involving a non-uniform magnetization state with the nucleation of many vortices (FIG. 10B). In contrast, the magnetization maps as shown in FIG. 9B in the $D_{xx}$ device do not involve the excitation of high order spin wave modes, and are more coherent. Indeed, it is the excitation of these modes that leads to a non-monotonic reversal process and requires longer current pulses to complete a reliable switching event. Moreover, it can be observed from the plot of the time evolution of $<n_{ix}>$ that the precession frequency is non-single-valued, indicating that different regions of the magnetic nano-element precess at different frequencies.

Switching based on the scheme described above was experimentally investigated by examining devices wherein the MTJ was patterned into right trapezoid shapes. FIGS. 11A and 11B illustrate scanning electron microscope (SEM) micrographs of two such devices that have been fabricated, where the MTJ is 150 nm and 100 nm long at the two bases, and has a width of 75 nm. The MTJ stack is patterned into a trapezoidal shape down to the W(O) layer, using the same fabrication procedure as was used to fabricate the $D_{xy}$ devices. These devices will be referred to with negative and positive sloped left legs as $D_{xx-}$ and $D_{xx+}$, with the last subscript letter representing the slope of the trapezoid's left leg.

Figures 12A, 12B:
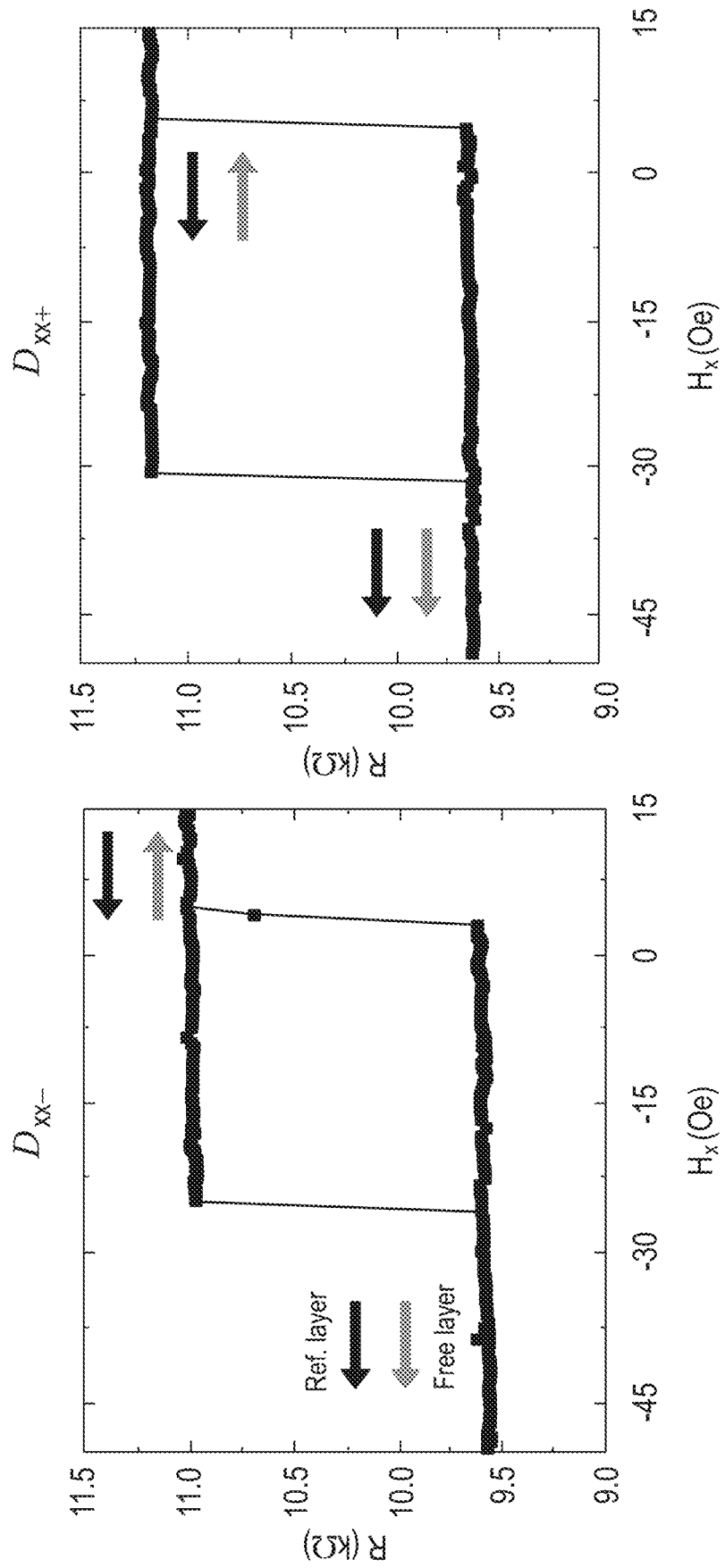
FIGS. 12A-12B illustrate the measured RH loops for the $D_{xx-}$ and $D_{xx+}$ devices, respectively, with inset symbols showing the reference layer and free layer magnetization orientation.

FIGS. 11C and 11D show the remnant state, as calculated by micromagnetic simulations, of the magnetization of these two devices, respectively. The RH loops of the $D_{xx-}$ and $D_{xx+}$ devices, respectively, for a magnetic field applied, $H_x$, along the x direction, are shown in FIGS. 12A and 12B. Both devices have nominally identical RH loops, which implies that the reference layer magnetization in both devices are oriented in the same direction. The magnetization direction of the free and reference layers is in FIGS. 12A and 12B. The current induced switching for $D_{xx-}$ and $D_{xx+}$ devices performed using 1 ms current pulses are shown in the RI loops in FIGS. 12C and 12D, respectively. A magnetic field applied along the x direction was also applied in order to compensate for the dipole field from the reference layer for the current induced switching measurements.

Figure 12D:
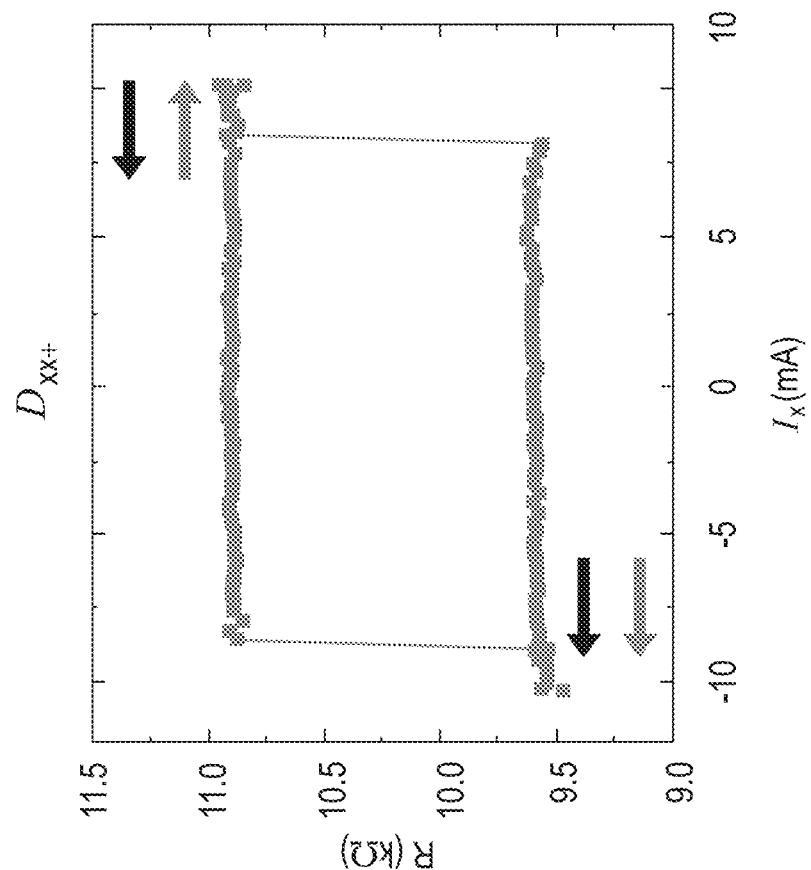
FIGS. 12C-12D illustrate the measure RI loops for the $D_{xx-}$ and $D_{xx+}$ devices, respectively with inset symbols showing the reference layer and free layer magnetization orientation.
Figure 12C:
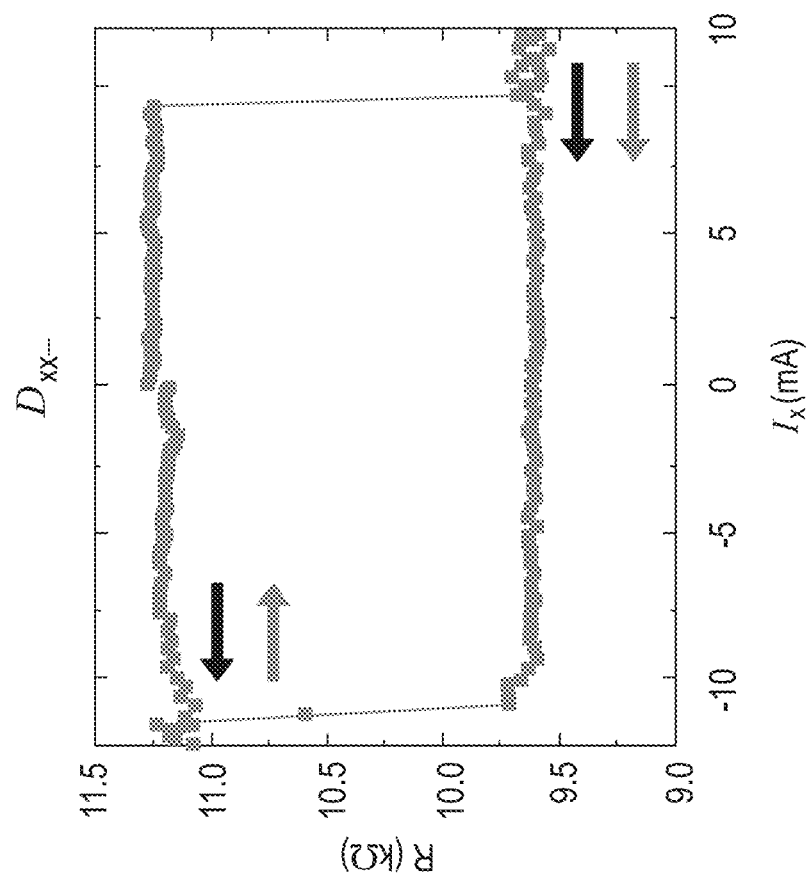

In the $D_{xx-}$ device, positive (negative) current drives switching from AP→P (P→AP), respectively, while the opposite occurs in the $D_{xx+}$. The direction of magnetization that has been switched under a given current can be determined by comparing RH loops and RI loops for a device of a given geometry, and are shown in the inset in FIGS. 12C and 12D for both devices. As the reference layer magnetization orientation is fixed under the current pulse, the free layer magnetization has switched in different directions with the same current polarity for the $D_{xx+}$ and $D_{xx-}$ devices. The switching observed experimentally in FIGS. 12C-12D is indeed consistent with what is predicted by the micromagnetic simulations (FIGS. 3A and 3D). The truth tables (FIGS. 13A-13B) summarize the basic switching operations for the $D_{xx-}$ and $D_{xx+}$ devices.

Deterministic switching of such devices as determined by their geometry can be potentially useful in building non-volatile nanomagnetic logic circuits which require the switching of several nanomagnets in a complementary manner. Shown is the operation of a non-volatile inverter (NOT gate circuit) that can be built using $D_{xx+}$ and $D_{xx-}$ devices that share a common W(O) layer (FIG. 10). If both devices have their reference layer pointing in the same direction, the $D_{xx+}$ and $D_{xx-}$ switch to opposite resistance states under the application of the same polarity current. Following the convention that the reference layer magnetization points towards the −x direction, the $D_{xx+}$ device will have a higher resistance compared to the $D_{xx-}$ device for a positive current.

Likewise, upon application of the reverse current polarity pulse, the $D_{xx-}$ device will have a higher resistance compared to the $D_{xx+}$ device.

Figure 15B:
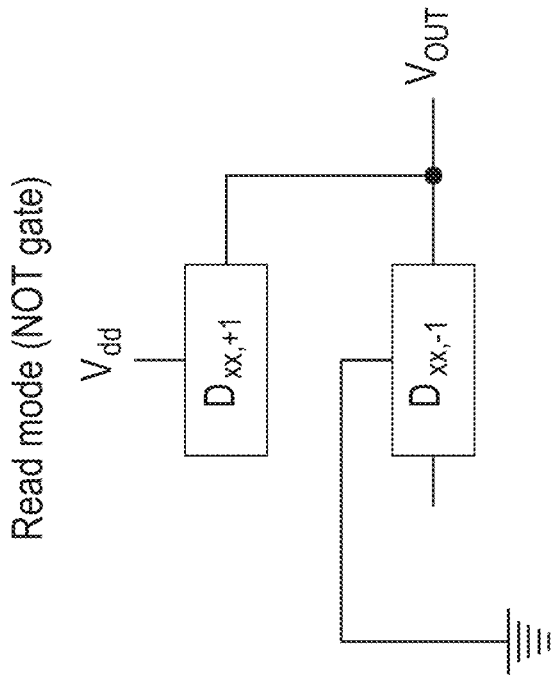
FIGS. 15A-15B illustrate an equivalent circuit diagram of the non-volatile (NOT gate) inverter circuits in the write and read mode, respectively.
Figure 15A:
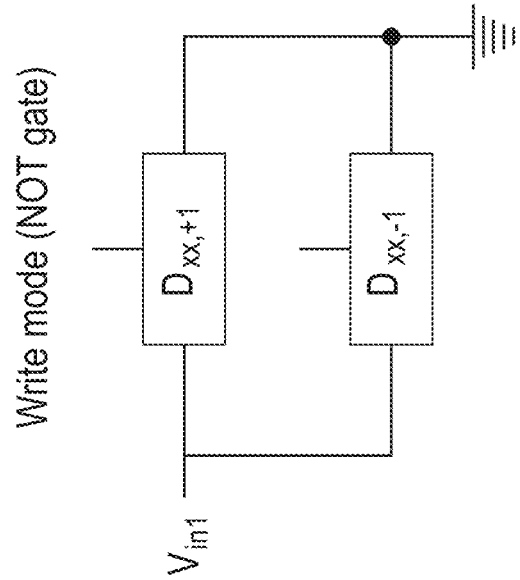

FIGS. 15A and 15B show an equivalent circuit model of the non-volatile inverter device. The circuit model for the NOT gate contains two devices labeled as $D_{xx+}$ and $D_{xx-}$. In the write mode (FIG. 15A), the voltage input ($V_{in1}$) is applied to the write+terminal of both $D_{xx+}$ and $D_{xx-}$ devices, and the write –terminal of both devices grounded. During the read mode, $V_{DD}$ is applied to the read terminal of $D_{xx+}$ and the write –terminals of $D_{xx+}$ and $D_{xx-}$ are connected to $V_{out}$, while the read terminal of $D_{xx-}$ is grounded. In a realistic device application, the supply voltage $V_{DD}$ on $D_{xx+}$ and the ground on signal on $D_{xx-}$ can be left connected during the entire device operation since the tunnel junction resistance is much larger than the resistance of the spin Hall layer, so during the application of VIN across the spin Hall layer during the write mode, most of the current will flow across the spin Hall layer.

Figure 16:
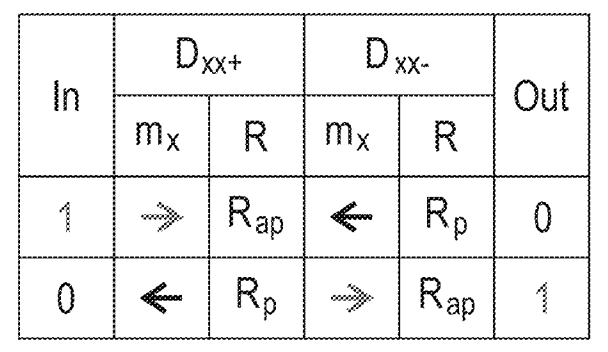
Figure 17:
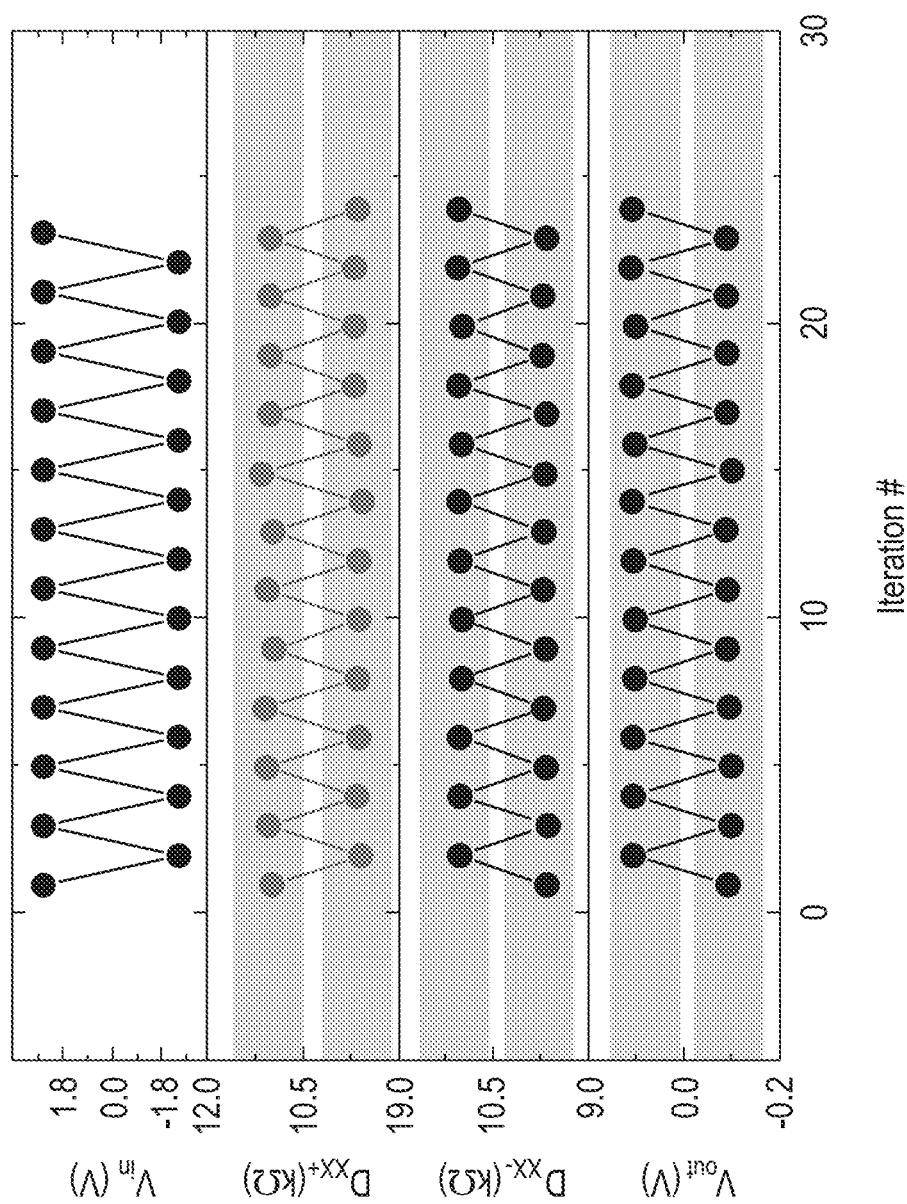
FIG. 17 depicts the experimental demonstration of an inverter operation based on the serial connection of $D_{xx-}$ and $D_{xx+}$ devices. The input voltage, resistance of both devices, and output voltage as a function of iteration number are plotted.

The $D_{xx+}$ and $D_{xx-}$ device can be thought of as sort of complementary devices similar to transistors in CMOS technology. The connection of both devices in series thus functions as a non-volatile inverter, as the logical output will remain once the $D_{xx+}$ and $D_{xx-}$ devices have been switched to their respective states. The truth table in FIG. 16 summarizes the inverter operation. The operation of such an inverter circuit up to 20 cycles is demonstrated (FIG. 17). 2.5 V and 1 ms long pulses are used in this demonstration. The generalization of this type of logic to build AND and OR gates is thus straightforward and borrows the concepts from CMOS logic. The advantage in this circuit compared to CMOS is that it is non-volatile, and has no static power dissipation. This scheme may also be used to control the state of nano-magnetic elements in nano-magnetic logic schemes, which require magnetic nano-elements to be coupled by their dipole fields and in close proximity. Moreover, improvements in the TMR and spin torque efficiency of the spin orbit material will increase the performance characteristics of the logic device presented here.

Embodiments of this invention use a magnetic nano-element that is patterned into an asymmetric shape, allowing for the switching of the magnetic nano-element with spin orbit torque where the magnetization and writing current are collinear in the absence of external magnetic field. In the preferred embodiment, the magnetic nano-element is in-plane magnetized and forms a part of a MTJ. The state of the nano-magnet is discerned from the magneto-resistive read-out across the MTJ.

One aspect of this invention is that by lithographic patterning of the device geometry to alter its micromagnetic state, the switching trajectory and end magnetic state of the magnetic free layer can be controllably manipulated. A secondary aspect of this invention is that there are no thermal fluctuations required to initiate switching as the spin polarization direction of the spin polarized currents generated by the spin orbit interaction are non-collinear to the magnetization direction. This can potentially reduce the write error rates that are commonly observed in the short pulse length operation in conventional two terminal STT-MRAM devices.

Another aspect of this invention is that by forming mirror imaged patterned devices, the switching of two magnetic nano-elements into complementary states under the same write current direction can be achieved. Furthermore, such complementary switching of said magnetic nano-element devices can form a non-volatile logic circuit. The present invention discloses a non-volatile inverter circuit formed from such magnetic nano-elements.

Figure 14:
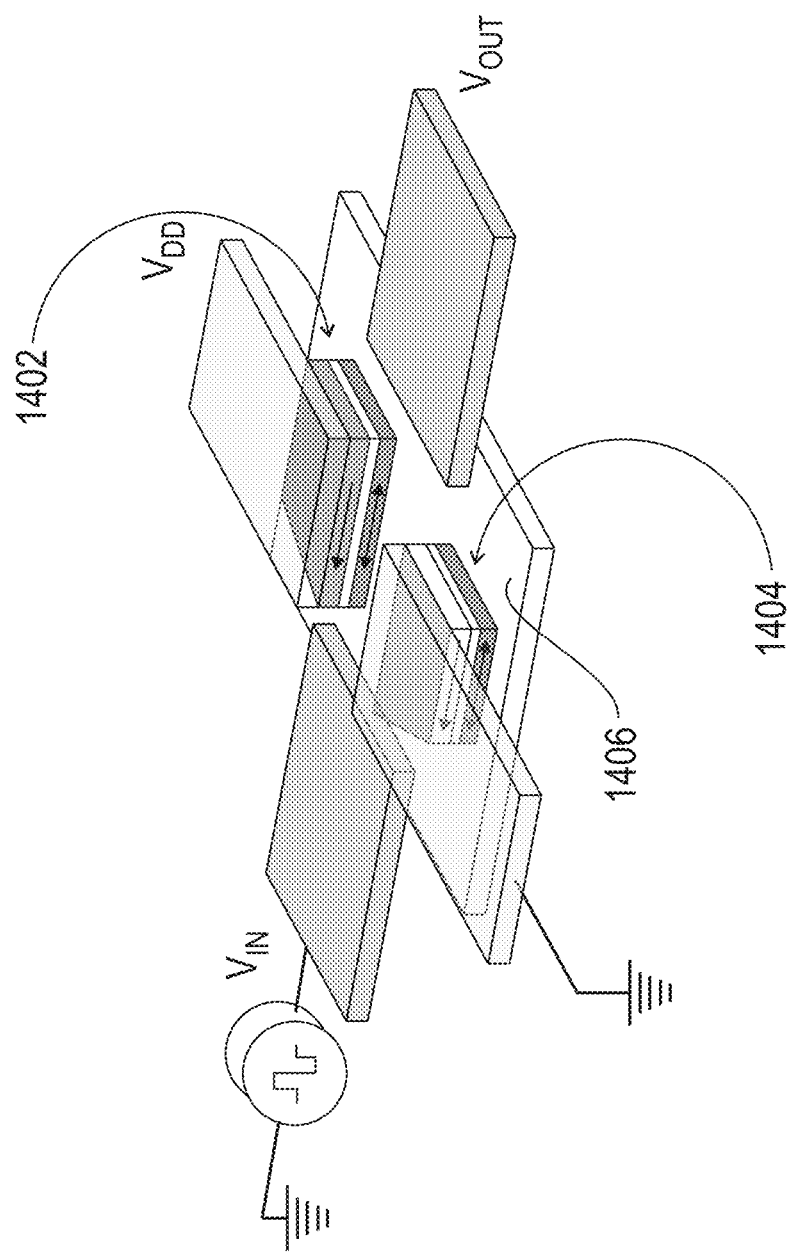
FIG. 14 illustrates a schematic of a non-volatile inverter (NOT gate) circuit realized with mirror imaged $D_{xx-}$ and $D_{xx+}$ devices connected in series and sharing a common W(O) layer.

In another embodiment, the present invention provides a device comprising: (a) a first magnetic tunnel junction (MTJ), the first MTJ comprising: (i) a first magnetic layer; (ii) a first tunnel barrier layer underlying the first magnetic layer; and (iii) a second magnetic layer underlying the tunnel barrier; (b) a second magnetic tunnel junction (MTJ), the second MTJ comprising: (i) a third magnetic layer; (ii) a second tunnel barrier layer underlying the first magnetic layer; and (iii) a fourth magnetic layer underlying the tunnel barrier; (c) a common spin orbit torque (SOT) generating layer, the common SOT generating layer directly underlying both the second magnetic layer of the first MTJ and fourth magnetic layer of the second MTJ; wherein a SOT generated in the common SOT generating layer sets a first magnetic state in the second magnetic layer and sets a second magnetic state in the fourth magnetic layer, the first magnetic state opposite that of the second magnetic state. FIG. 14 depicts such a non-limiting example illustrating this embodiment, where the two MTJs 1402 and 1404 1406 share a common SOT generating layer 1406.

In FIG. 14, a circuit is formed of a non-volatile inverter (NOT gate) through a serial connection of two MTJs. FIG. 14 illustrates a schematic illustration of a non-volatile inverter (NOT gate) realized with mirror imaged $D_{xx-}$ and $D_{xx+}$ devices connected in series and sharing a common W(O) layer. FIG. 15A shows a circuit level schematic of the non-volatile inverter in the write mode of the circuit, where the write voltage yin is applied to both devices. In the read mode (FIG. 15B), there is a serial connection of the two MTJs between $V_{DD}$ and ground. Here, the writing terminals are disconnected from a power source.

Figure 15D:
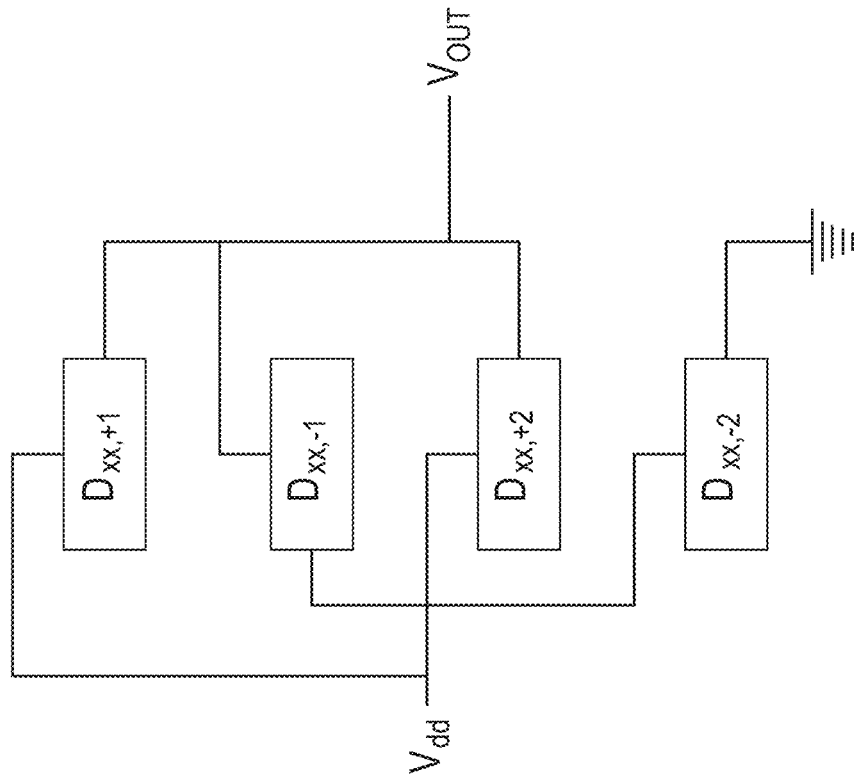
FIGS. 15C-D depict a non-limiting implementation of a NAND gate in write and read mode.
Figure 15C:
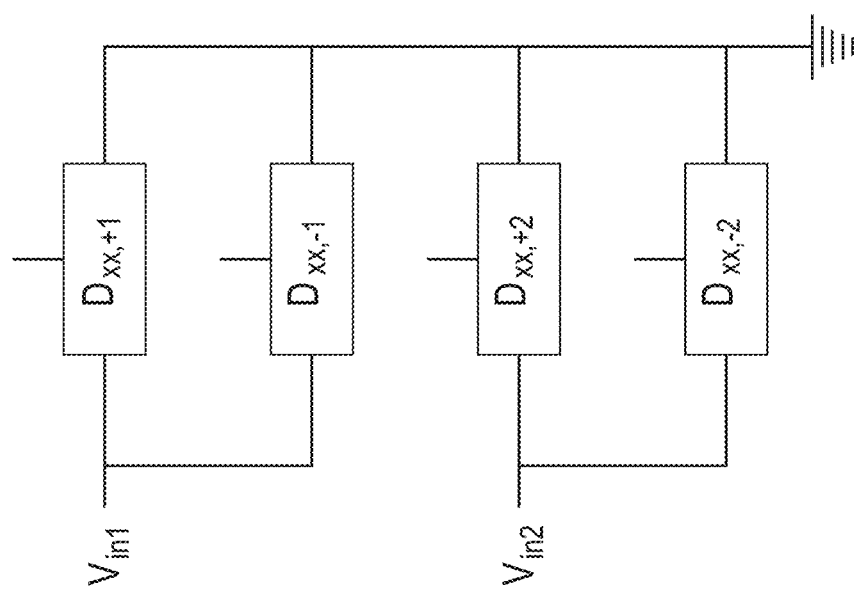
Figure 15F:
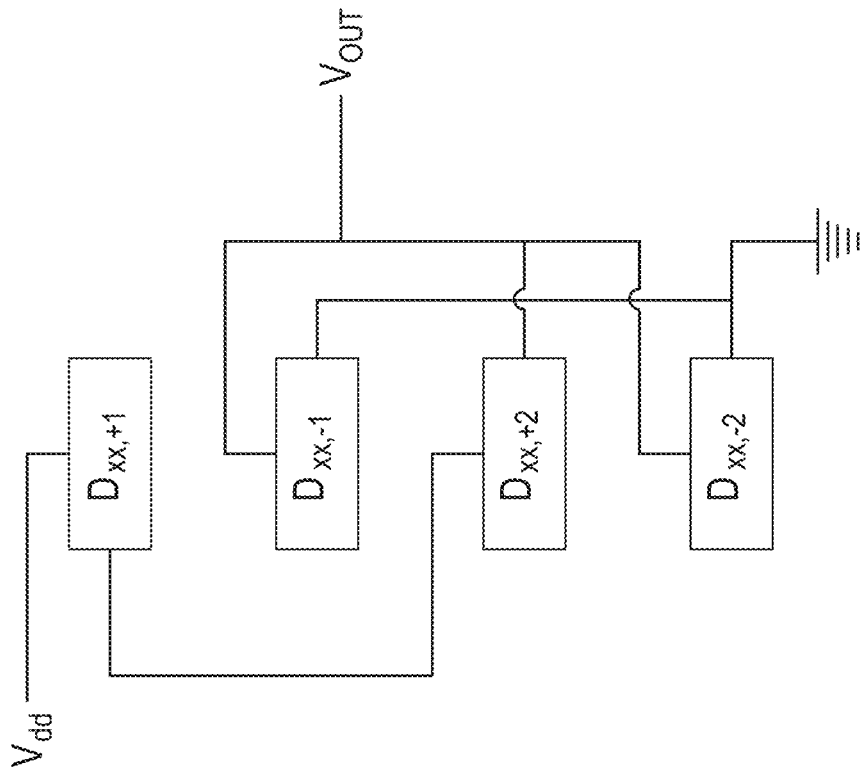
FIGS. 15E-F depict a non-limiting implementation of a NOR gate in write and read mode.
Figure 15E:
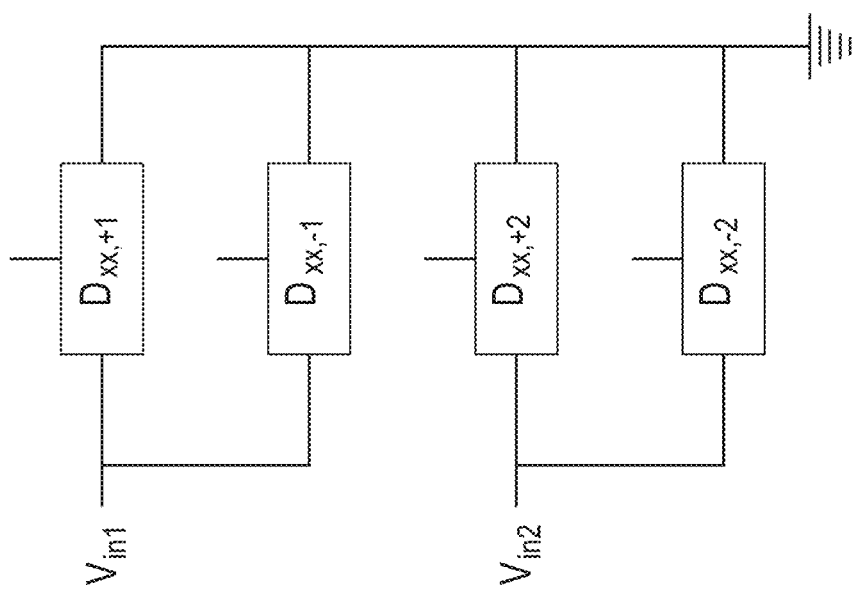

In another embodiment, a circuit is formed of a non-volatile NAND gate and NOR gate through serial and parallel connection of the MTJs. FIGS. 15C-D depict a non-limiting implementation of a NAND gate in write and read mode. FIGS. 15E-F depict a non-limiting implementation of a NOR gate in write and read mode. For both the NAND gate and NOR gate, the write mode circuit is identical, and uses two $D_{xx+}$ and two $D_{xx-}$ devices. The devices' write plus terminal of one set of $D_{xx+}$ and $D_{xx-}$ devices is connected to $V_{in1}$, while for another set is connected to $V_{in2}$. For readout, in the NAND gate, the $D_{xx-}$ devices are connected in series while the $D_{xx+}$ are connected in parallel. For readout, in the NOR, the $D_{xx-}$ devices are connected in parallel while the $D_{xx+}$ are connected in series.

CONCLUSION

Embodiments, described above, show an effective implementation of a control of switching trajectory in spin orbit torque devices by micromagnetic configuration. While various preferred embodiments have been shown and described, it will be understood that there is no intent to limit the invention by such disclosure, but rather, it is intended to cover all modifications falling within the spirit and scope of the invention, as defined in the appended claims.

What is claimed is:

1. A three-terminal device comprising:
   (a) a magnetic tunnel junction (MTJ), the MTJ comprising: (i) a first magnetic layer; (ii) a tunnel barrier layer underlying the first magnetic layer; and (iii) a second magnetic layer underlying the tunnel barrier; and
   (b) a spin orbit torque (SOT) generating layer, the SOT generating layer directly underlying the second magnetic layer;

wherein the second magnetic layer has a shape that is non-symmetrical, such that an average magnetization of a remnant state associated with the second magnetic layer has an in-plane component that is orthogonal to a current direction in the SOT generating layer.

2. The three-dimensional device of claim 1, wherein the device is part of a non-volatile inverter circuit formed from a serial connection of the MTJ in (a) and another MTJ.

3. The device of claim 2, wherein the SOT generating layer is made from a material that exhibits the spin Hall effect.

4. The device of claim 3, wherein the material is selected from the group consisting of W, Pt, Ta, and combinations thereof.

5. The three-dimensional device of claim 1, wherein the device is part of either a non-volatile NAND gate or an NOR gate, the NAND gate or NOR gate formed using a combination of a serial and parallel connection of the MTJ in (a) and three other MTJs.

6. The device of claim 1, wherein the non-symmetric shape is a trapezoid.

7. The device of claim 1, wherein the three-terminal device forms part of a non-volatile cache memory device.

8. The device of claim 1, wherein the three-terminal device forms part of a cryogenic memory device.

9. The device of claim 1, wherein the SOT generating layer is made of oxygen-doped tungsten.

10. A device comprising:
    (a) a first magnetic tunnel junction (MTJ), the first MTJ comprising: (i) a first magnetic layer; (ii) a first tunnel barrier layer underlying the first magnetic layer; and (iii) a second magnetic layer underlying the first tunnel barrier;
    (b) a second magnetic tunnel junction (MTJ), the second MTJ comprising: (i) a third magnetic layer; (ii) a second tunnel barrier layer underlying the first magnetic layer; and (iii) a fourth magnetic layer underlying the second tunnel barrier;
    (c) a common spin orbit torque (SOT) generating layer, the common SOT generating layer directly underlying both the second magnetic layer of the first MTJ and the fourth magnetic layer of the second MTJ;
    wherein an SOT generated in the common SOT generating layer sets a first magnetic state in the second magnetic layer and sets a second magnetic state in the fourth magnetic layer, the first magnetic state opposite that of the second magnetic state, and
    wherein the first MTJ and the second MTJ are each shaped as an asymmetric element.

11. The device of claim 10, wherein the asymmetric element is shaped like a trapezoid.

12. The device of claim 10, wherein the first and/or third magnetic layer comprises any of, or a combination of, the following: a synthetic antiferromagnetic (SAF) layer, an exchanged biased layer, and a layer having a coercivity higher than that of the second magnetic layer.

13. The device of claim 10, wherein the second and/or fourth magnetic layer comprises CoFeB alloy and/or NiFe alloy.

14. The device of claim 10, wherein the device forms part of a non-volatile cache memory device.

15. The device of claim 10, wherein the device forms part of a cryogenic memory device.

16. The device of claim 10, wherein the common SOT generating layer is made of oxygen-doped tungsten.

17. The device of claim 10, wherein the common SOT generating layer is made from a material that exhibits the spin Hall effect.

18. The device of claim 17, wherein the material is selected from the group consisting of W, Pt, Ta, and combinations thereof.

19. A method, comprising:
    (a) providing a three-terminal device that includes, in order, a spin-orbittorque (SOT) generating layer, an in magnetized free layer whose magnetic moment can be switched with spin transfer torque created by the SOT generating layer, a tunnel barrier, and a reference magnetic layer whose orientation remains fixed during device operation, wherein:
    write-plus and write-minus terminals are in electrical contact with opposite ends of the SOT generating layer;
    a read terminal is in electrical contact with the reference magnetic layer; and
    the magnetic free layer has a shape that is non-symmetrical, such that an average magnetization of the free layer' remnant state has an in-plane component that is orthogonal to the current direction; and
    (b) passing current along the SOT generating layer, between its terminals, thereby switching the magnetic state of the magnetic free layer even in the absence of an applied magnetic field, when the direction of the passed current is oriented along the easy axis of the magnetic free layer.

20. The method of claim 19, wherein the reference layer comprises any of, or a combination of, the following: a synthetic antiferromagnetic (SAF) layer, an exchanged biased layer, and a layer having a coercivity higher than that of the second magnetic layer.

21. The method of claim 19, wherein the magnetic free layer includes no magnetic domain walls in a remnant state.

22. The method of claim 19, wherein the anisotropy of the magnetic free layer arises predominately from magnetostatic interactions between magnetic moments in the magnetic free layer.

23. The method of claim 19, wherein the magnetic free layer comprises CoFeB alloy and/or NiFe alloy.

24. The method of claim 19, wherein the three-terminal device forms part of a non-volatile cache memory device.

25. The method of claim 19, wherein the three-terminal device forms part of a cryogenic memory device.

26. The method of claim 19, wherein the SOT generating layer is made of oxygen-doped tungsten.

27. The method of claim 19, wherein the SOT generating layer is made from one or more materials that exhibit the spin Hall effect.

* * * * *